(12) United States Patent
Yeong et al.

(10) Patent No.: US 11,588,018 B2
(45) Date of Patent: Feb. 21, 2023

(54) SEMICONDUCTOR DEVICE STRUCTURE WITH NANOSTRUCTURE AND METHOD FOR FORMING THE SAME

(71) Applicant: Taiwan Semiconductor Manufacturing Company, Ltd., Hsinchu (TW)

(72) Inventors: Sai-Hooi Yeong, Zhubei (TW); Bo-Feng Young, Taipei (TW); Ching-Wei Tsai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 81 days.

(21) Appl. No.: 17/161,017

(22) Filed: Jan. 28, 2021

(65) Prior Publication Data

US 2022/0238647 A1    Jul. 28, 2022

(51) Int. Cl.
*H01L 29/06* (2006.01)
*H01L 29/78* (2006.01)
*H01L 29/417* (2006.01)
*H01L 29/423* (2006.01)
*H01L 27/088* (2006.01)
*H01L 29/40* (2006.01)
(Continued)

(52) U.S. Cl.
CPC .. *H01L 29/0673* (2013.01); *H01L 21/823418* (2013.01); *H01L 27/088* (2013.01); *H01L 29/401* (2013.01); *H01L 29/41733* (2013.01); *H01L 29/42392* (2013.01); *H01L 29/66439* (2013.01); *H01L 29/66742* (2013.01); *H01L 29/7845* (2013.01); *H01L 29/78618* (2013.01)

(58) Field of Classification Search
CPC ........ H01L 29/0673; H01L 21/823418; H01L 27/088; H01L 29/401; H01L 29/41733; H01L 29/42392; H01L 29/66439; H01L 29/66742; H01L 29/7845; H01L 29/78618
USPC ........................................................ 257/288
See application file for complete search history.

(56) References Cited

U.S. PATENT DOCUMENTS 9,209,247 B2    12/2015  Colinge et al.
9,236,267 B2     1/2016  De et al.
(Continued)

FOREIGN PATENT DOCUMENTS

KR    10-2018-0060948 A    6/2018
KR    10-2019-0036282 A    4/2019
TW         202038472 A    10/2020

OTHER PUBLICATIONS

Korean Notice of Allowance dated Apr. 20, 2022 for Application No. 10-2021-0040669 with an English translation.

*Primary Examiner* — Tong-Ho Kim
(74) *Attorney, Agent, or Firm* — Birch, Stewart, Kolasch & Birch, LLP

(57) ABSTRACT

A semiconductor device structure is provided. The semiconductor device structure includes a substrate. The semiconductor device structure includes a first nanostructure over the substrate. The semiconductor device structure includes a gate stack over the substrate and surrounding the first nanostructure. The semiconductor device structure includes a first source/drain layer surrounding the first nanostructure and adjacent to the gate stack. The semiconductor device structure includes a contact structure surrounding the first source/drain layer, wherein a first portion of the contact structure is between the first source/drain layer and the substrate.

20 Claims, 41 Drawing Sheets

(51) Int. Cl.
   *H01L 29/66* (2006.01)
   *H01L 29/786* (2006.01)
   *H01L 21/8234* (2006.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2013/0341704 A1* | 12/2013 | Rachmady .......... H01L 29/4232 977/890 |
| 2014/0001520 A1* | 1/2014 | Glass .................... H01L 29/167 257/E21.409 |
| 2019/0326395 A1 | 10/2019 | Ando et al. |
| 2020/0091288 A1* | 3/2020 | Lee ..................... H01L 29/6656 |

* cited by examiner

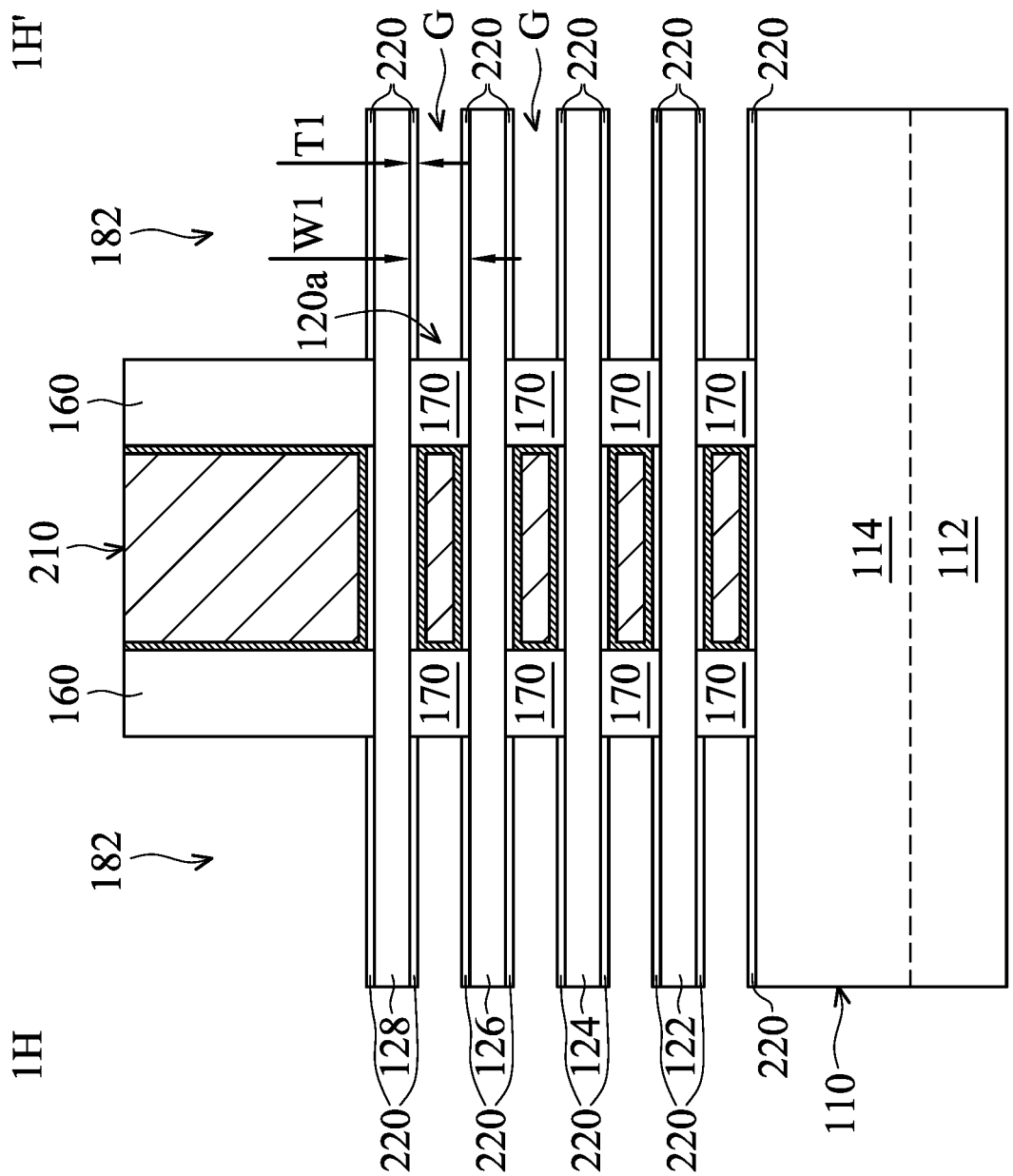

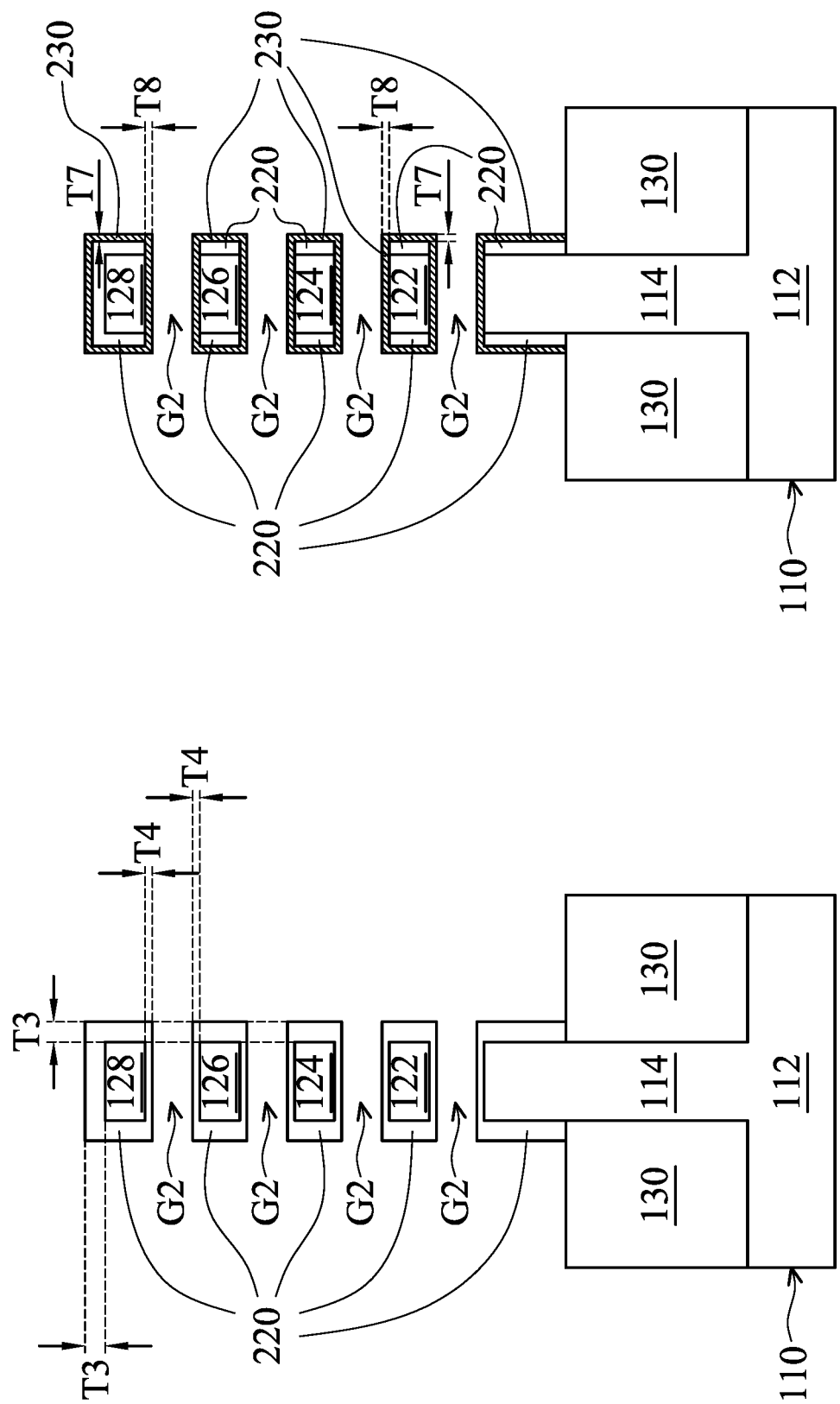

US 11,588,018 B2

SEMICONDUCTOR DEVICE STRUCTURE WITH NANOSTRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1K are cross-sectional views of various steps of a process for forming a semiconductor device structure, in accordance with some embodiments.

FIG. 1A-1 is a perspective view of the semiconductor device structure of FIG. 1A, in accordance with some embodiments.

FIG. 1C-1 is a perspective view of the semiconductor device structure of FIG. 1C, in accordance with some embodiments.

FIG. 1F-1 is a top view of the semiconductor device structure of FIG. 1F, in accordance with some embodiments.

FIG. 1G-1 is a top view of the semiconductor device structure of FIG. 1G, in accordance with some embodiments.

FIG. 1G-2 is a cross-sectional view illustrating the semiconductor device structure along a sectional line 1G-2-1G-2' in FIG. 1G-1, in accordance with some embodiments.

FIG. 1H-1 is a perspective view of the semiconductor device structure of FIG. 1H, in accordance with some embodiments.

FIG. 1I-1 is a perspective view of the semiconductor device structure of FIG. 1I, in accordance with some embodiments.

FIG. 1J-1 is a perspective view of the semiconductor device structure of FIG. 1J, in accordance with some embodiments.

FIG. 1J-2 is a cross-sectional view illustrating the semiconductor device structure along a sectional line 1J-2-1J-2' in FIG. 1J-1, in accordance with some embodiments.

FIG. 1J-3 is a cross-sectional view illustrating the semiconductor device structure along a sectional line 1J-3-1J-3' in FIG. 1J-1, in accordance with some embodiments.

FIG. 2 is a cross-sectional view illustrating a semiconductor device structure, in accordance with some embodiments.

FIG. 3 is a cross-sectional view illustrating a semiconductor device structure, in accordance with some embodiments.

FIGS. 7A-7C are cross-sectional views of various steps of a process for forming a semiconductor device structure, in accordance with some embodiments.

FIG. 9C-1 is a perspective view of the semiconductor device structure of FIG. 9C, in accordance with some embodiments.

DETAILED DESCRIPTION

Figure 1A:
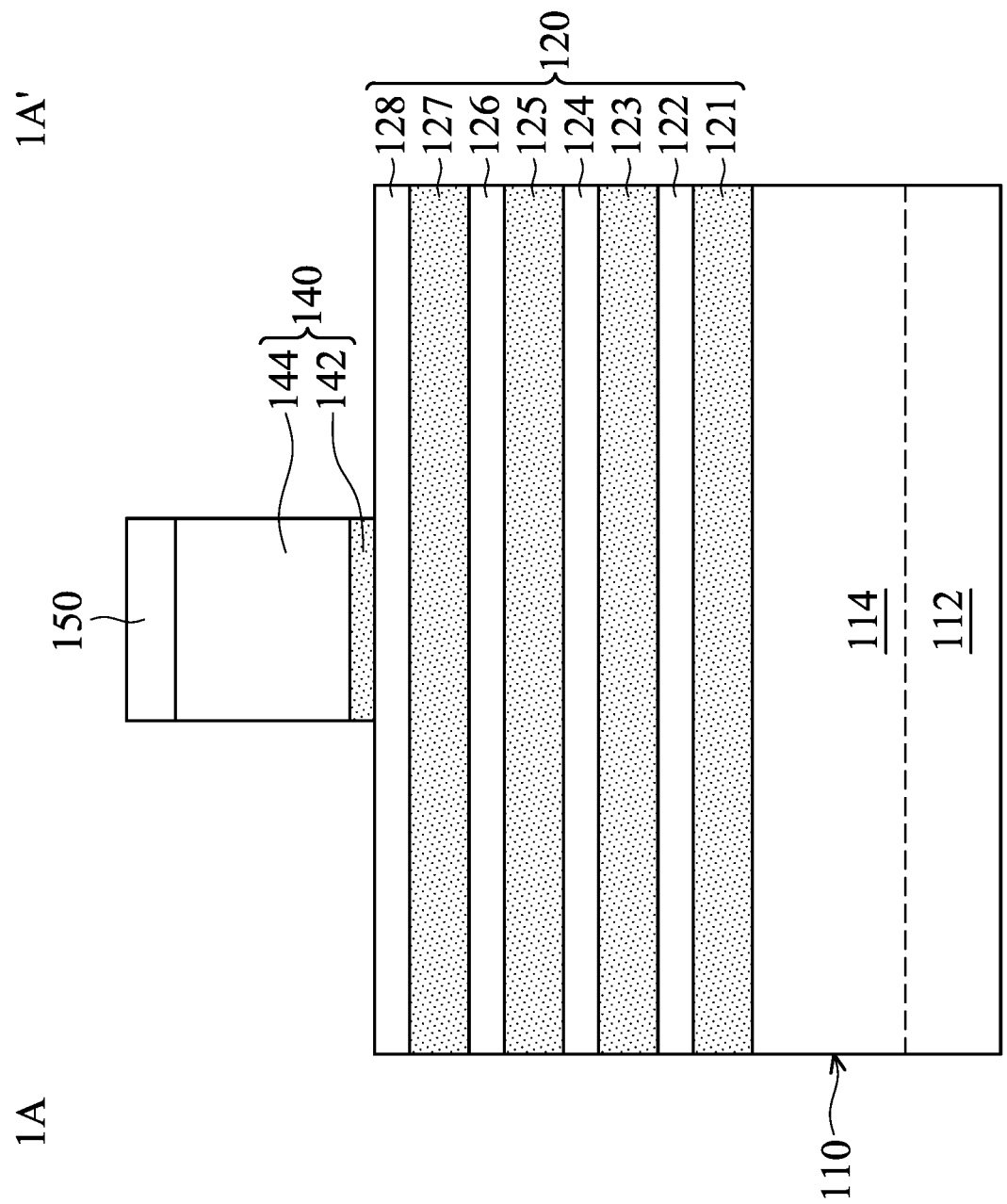

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" or "about" in the description, such as in "substantially flat" or in "substantially coplanar", etc., will be understood by the person skilled in the art. Where applicable, the term "substantially" may also include embodiments with "entirely", "completely", "all", etc. The term "about" in conjunction with a specific distance or size is to be interpreted so as not to exclude insignificant deviation from the specified distance or size. The term "substantially" or "about" may be varied in different technologies and be in the deviation range understood by the skilled in the art. For example, the term "substantially" or "about" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figures 1, 1A:
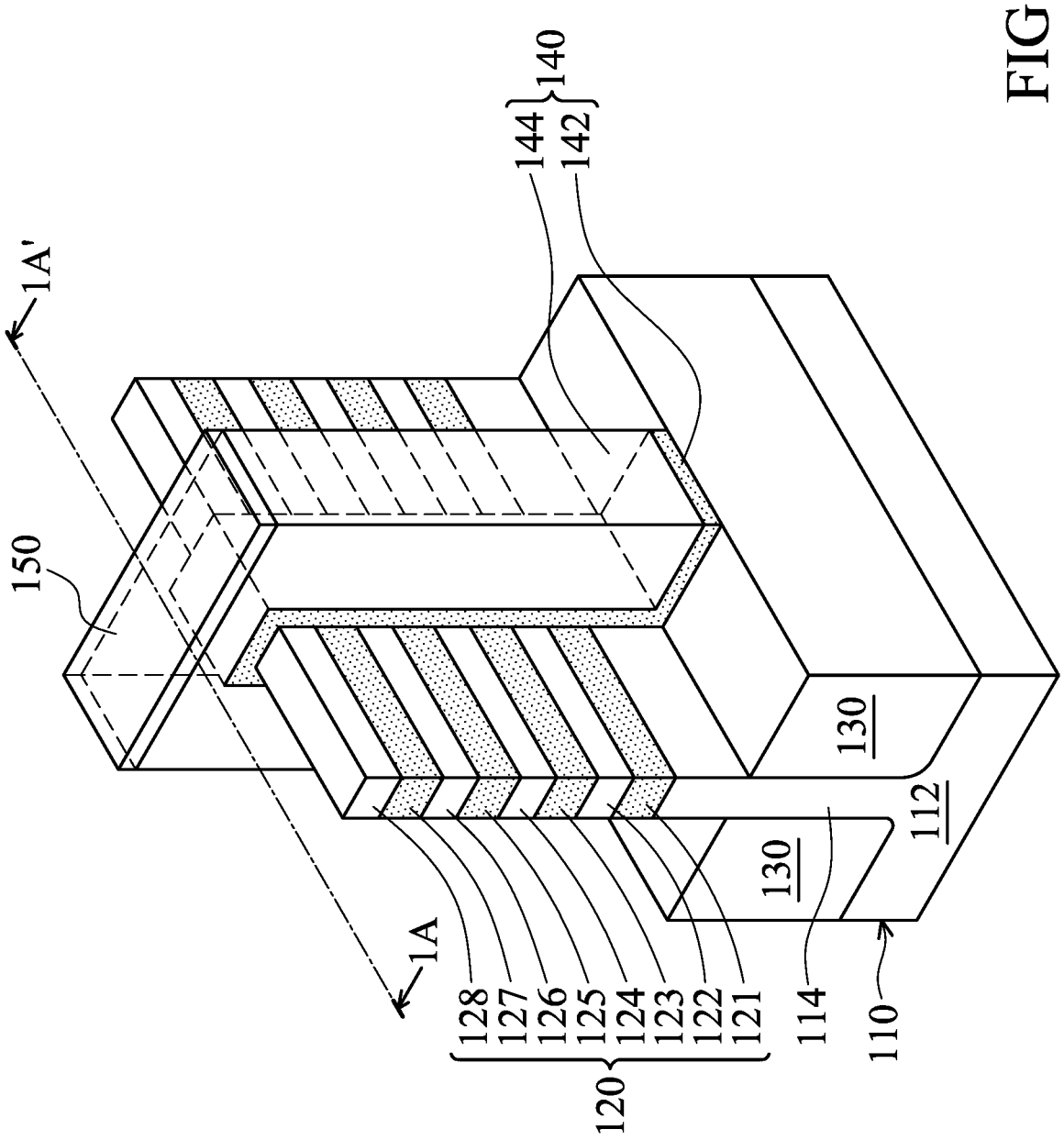

FIGS. 1A-1K are cross-sectional views of various steps of a process for forming a semiconductor device structure, in accordance with some embodiments. FIG. 1A-1 is a perspective view of the semiconductor device structure of FIG. 1A, in accordance with some embodiments. FIG. 1A is a cross-sectional view illustrating the semiconductor device structure along a sectional line 1A-1A' in FIG. 1A-1, in accordance with some embodiments.

As shown in FIGS. 1A and 1A-1, a substrate 110 is provided, in accordance with some embodiments. The substrate 110 has a base 112 and a fin 114 over the base 112, in accordance with some embodiments. The substrate 110 includes, for example, a semiconductor substrate. The substrate 110 includes, for example, a semiconductor wafer (such as a silicon wafer) or a portion of a semiconductor wafer.

In some embodiments, the substrate 110 is made of an elementary semiconductor material including silicon or germanium in a single crystal structure, a polycrystal structure, or an amorphous structure. In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIGS. 1A and 1A-1, a nanostructure stack 120 is formed over the fin 114, in accordance with some embodiments. The nanostructure stack 120 includes nanostructures 121, 122, 123, 124, 125, 126, 127, and 128, in accordance with some embodiments.

The nanostructures 121, 122, 123, 124, 125, 126, 127, and 128 are sequentially stacked over the fin 114, in accordance with some embodiments. The nanostructures 121, 122, 123, 124, 125, 126, 127, and 128 include nanowires or nanosheets, in accordance with some embodiments.

The nanostructures 121, 123, 125, and 127 are made of a same first material, in accordance with some embodiments. The first material is different from the material of the substrate 110, in accordance with some embodiments. The first material includes an elementary semiconductor material including silicon or germanium in a single crystal structure, a polycrystal structure, or an amorphous structure, in accordance with some embodiments.

The first material includes a compound semiconductor, such as silicon carbide, gallium arsenide, gallium phosphide, indium phosphide, indium arsenide, an alloy semiconductor, such as SiGe or GaAsP, or a combination thereof, in accordance with some embodiments.

The nanostructures 122, 124, 126, and 128 are made of a same second material, in accordance with some embodiments. The second material is different from the first material, in accordance with some embodiments. The second material is the same as the material of the substrate 110, in accordance with some embodiments. The second material includes an elementary semiconductor material including silicon or germanium in a single crystal structure, a polycrystal structure, or an amorphous structure, in accordance with some embodiments.

The second material includes a compound semiconductor, such as silicon carbide, gallium arsenide, gallium phosphide, indium phosphide, indium arsenide, an alloy semiconductor, such as SiGe or GaAsP, or a combination thereof, in accordance with some embodiments.

As shown in FIGS. 1A and 1A-1, an isolation layer 130 is formed over the base 112, in accordance with some embodiments. A lower portion of the fin 114 is embedded in the isolation layer 130, in accordance with some embodiments. The fin 114 is surrounded by the isolation layer 130, in accordance with some embodiments.

The isolation layer 130 is made of a dielectric material such as an oxide-containing material (e.g., silicon oxide), an oxynitride-containing material (e.g., silicon oxynitride), a low-k (low dielectric constant) material, a porous dielectric material, glass, or a combination thereof, in accordance with some embodiments.

The term "low-k material" means a material having a dielectric constant less than the dielectric constant of silicon dioxide, in accordance with some embodiments. The glass includes borosilicate glass (BSG), phosphoric silicate glass (PSG), borophosphosilicate glass (BPSG), fluorinated silicate glass (FSG), or a combination thereof, in accordance with some embodiments.

The isolation layer 130 is formed using a deposition process (or a spin-on process), a chemical mechanical polishing process, and an etching back process, in accordance with some embodiments. The deposition process includes a chemical vapor deposition (CVD) process, a high density plasma chemical vapor deposition (HDPCVD) process, a flowable chemical vapor deposition (FCVD) process, a sputtering process, or a combination thereof, in accordance with some embodiments.

As shown in FIGS. 1A and 1A-1, a gate stack 140 and a mask layer 150 are formed over the nanostructure stack 120, the fin 114, and the isolation layer 130, in accordance with some embodiments. The gate stack 140 includes a gate dielectric layer 142 and a gate electrode 144, in accordance with some embodiments. The gate electrode 144 is over the gate dielectric layer 142, in accordance with some embodiments.

The gate dielectric layer 142 is positioned between the gate electrode 144 and the nanostructure stack 120, in accordance with some embodiments. The gate dielectric layer 142 is also positioned between the gate electrode 144 and the fin 114, in accordance with some embodiments. The gate dielectric layer 142 is positioned between the gate electrode 144 and the isolation layer 130, in accordance with some embodiments.

The gate dielectric layer 142 is made of an oxide-containing material such as silicon oxide, in accordance with some embodiments. The gate dielectric layer 142 is formed using a chemical vapor deposition process and an etching process, in accordance with some embodiments. The gate electrode 144 is made of a semiconductor material such as polysilicon, in accordance with some embodiments. The gate electrode 144 is formed using a chemical vapor deposition process and an etching process, in accordance with some embodiments.

The mask layer 150 is positioned over the gate stack 140, in accordance with some embodiments. The mask layer 150 is made of a different material than the gate stack 140, in accordance with some embodiments. The mask layer 150 is made of nitrides (e.g., silicon nitride), oxynitride (e.g., silicon oxynitride), or a combination thereof, in accordance with some embodiments.

Figure 1B:
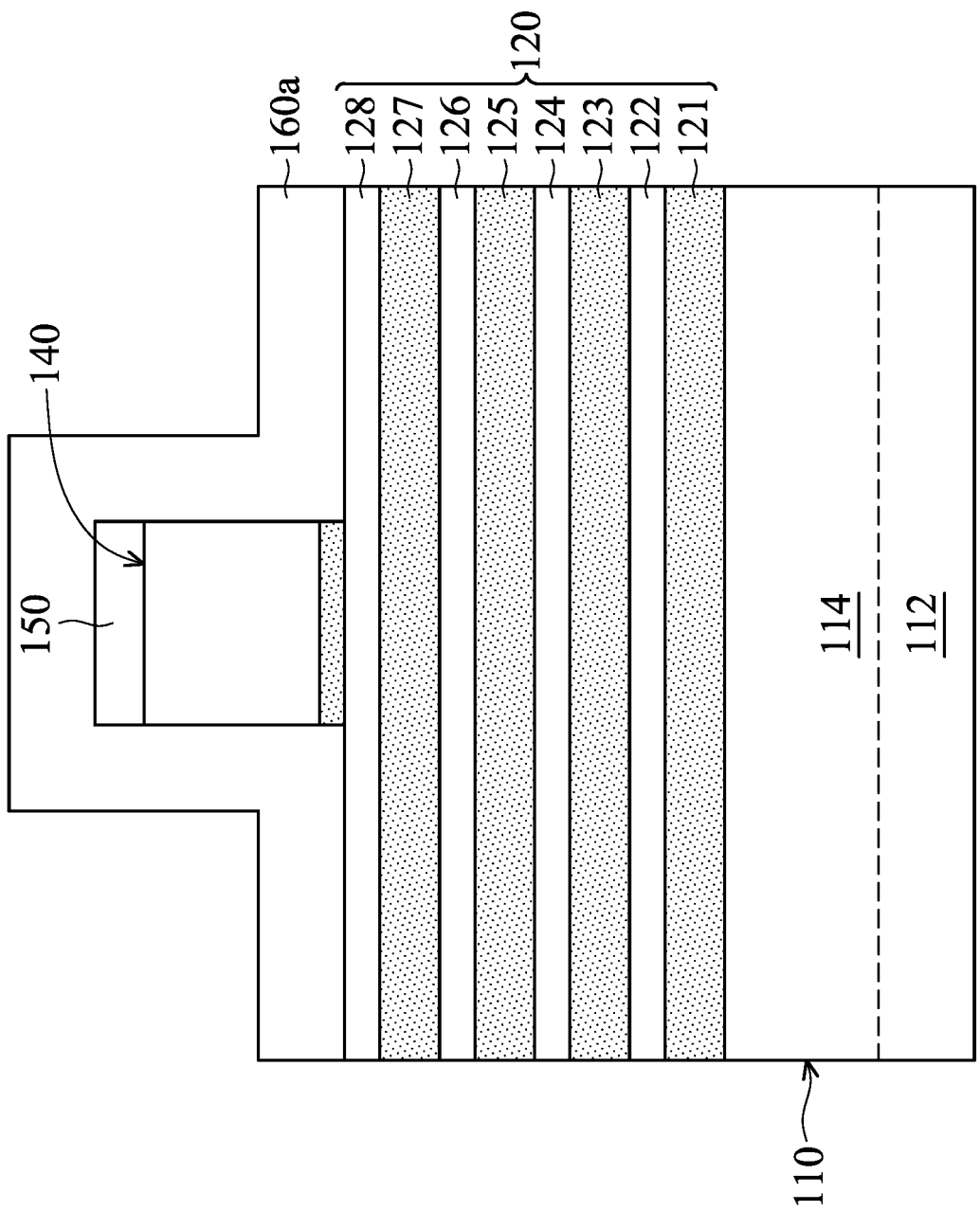

As shown in FIGS. 1A-1 and 1B, a spacer material layer 160*a* is formed over the mask layer 150, the gate stack 140, the nanostructure stack 120, and the isolation layer 130, in accordance with some embodiments. The spacer material layer 160*a* is made of a material different from that of the gate stack 140 and the mask layer 150, in accordance with some embodiments.

The spacer material layer 160*a* includes insulating materials, such as silicon oxide, silicon nitride, silicon oxynitride, or silicon carbide, in accordance with some embodiments. The formation of the spacer material layer 160*a* includes a deposition process, such as a chemical vapor deposition process, a physical vapor deposition process, an atomic layer deposition process, or the like, in accordance with some embodiments.

Figure 1C:
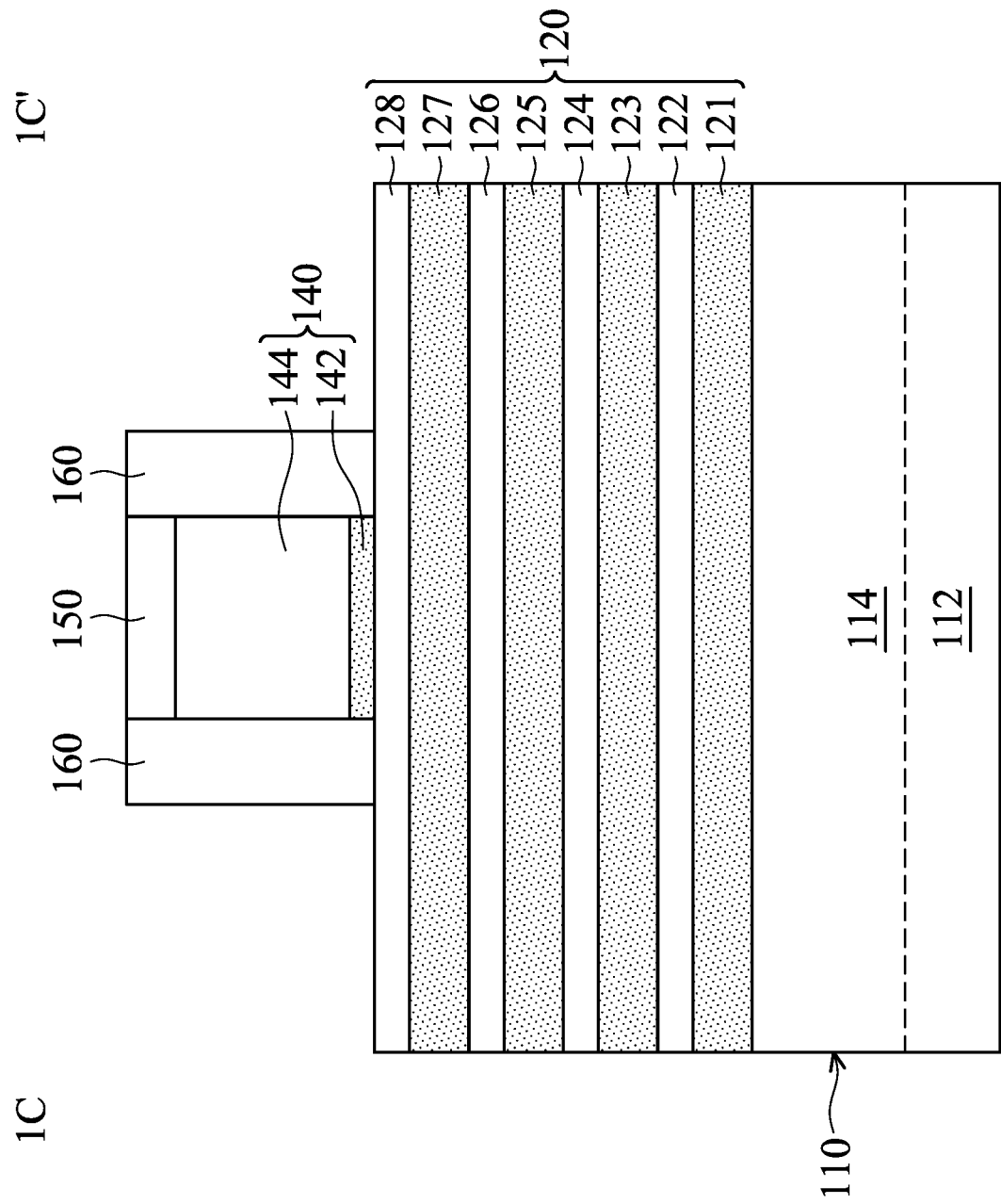
Figures 1, 1C:
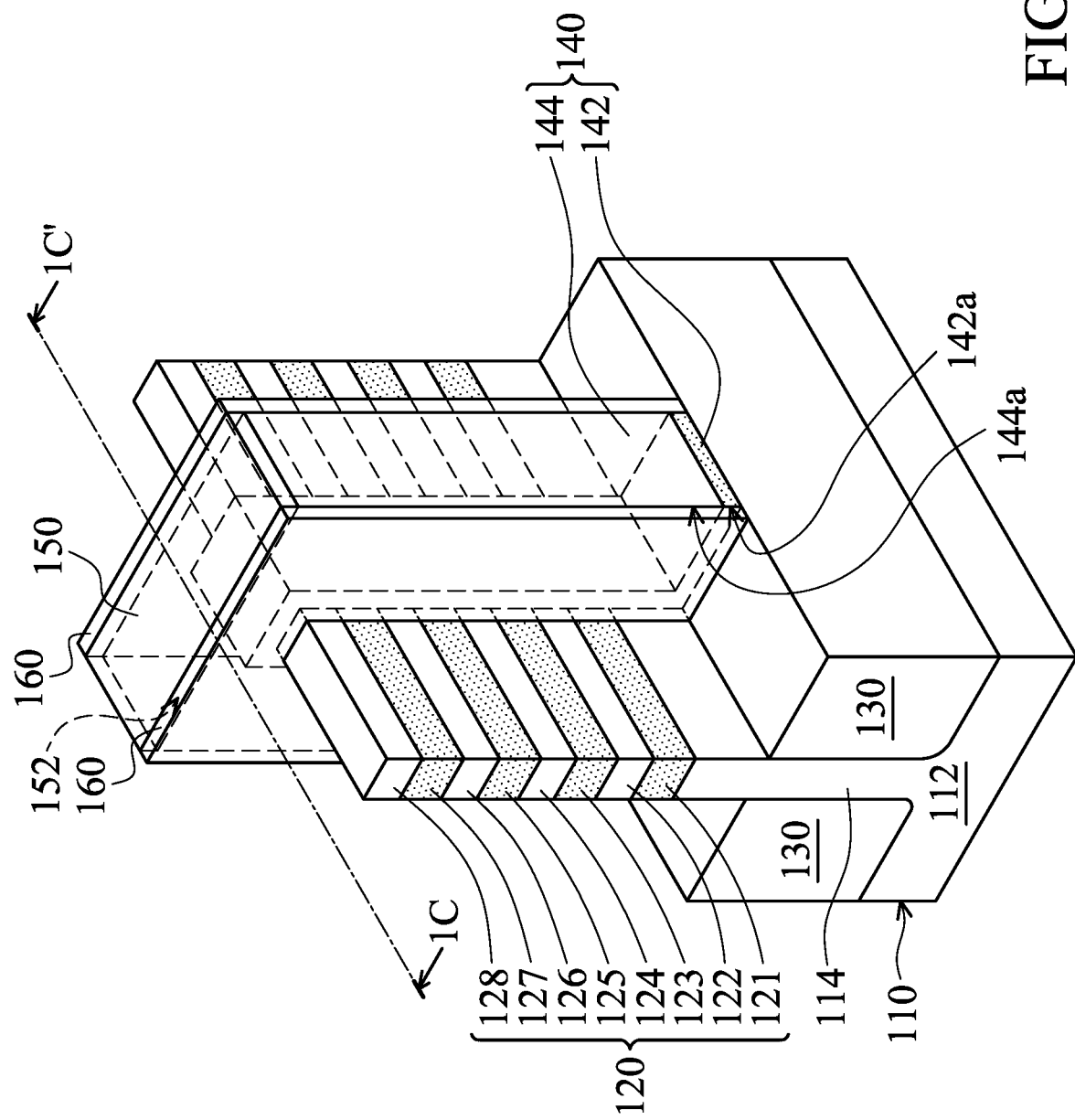

FIG. 1C-1 is a perspective view of the semiconductor device structure of FIG. 1C, in accordance with some embodiments. FIG. 1C is a cross-sectional view illustrating the semiconductor device structure along a sectional line 1C-1C' in FIG. 1C-1, in accordance with some embodiments.

As shown in FIGS. 1B, 1C and 1C-1, the spacer material layer 160*a* is partially removed, in accordance with some embodiments. The remaining spacer material layer 160*a* remains over sidewalls 152, 142*a* and 144*a* of the mask layer 150, the dielectric layer 142, and the gate electrode 144, in accordance with some embodiments. The remaining spacer material layer 160*a* forms a spacer structure 160, in accordance with some embodiments.

The spacer structure 160 surrounds the gate stack 140 and the mask layer 150, in accordance with some embodiments. The spacer structure 160 is positioned over the nanostructure stack 120, the fin structure 114 and the isolation layer 130, in accordance with some embodiments. The removal process includes an etching process such as an anisotropic etching process (e.g., a dry etching process), in accordance with some embodiments.

Figure 1D:
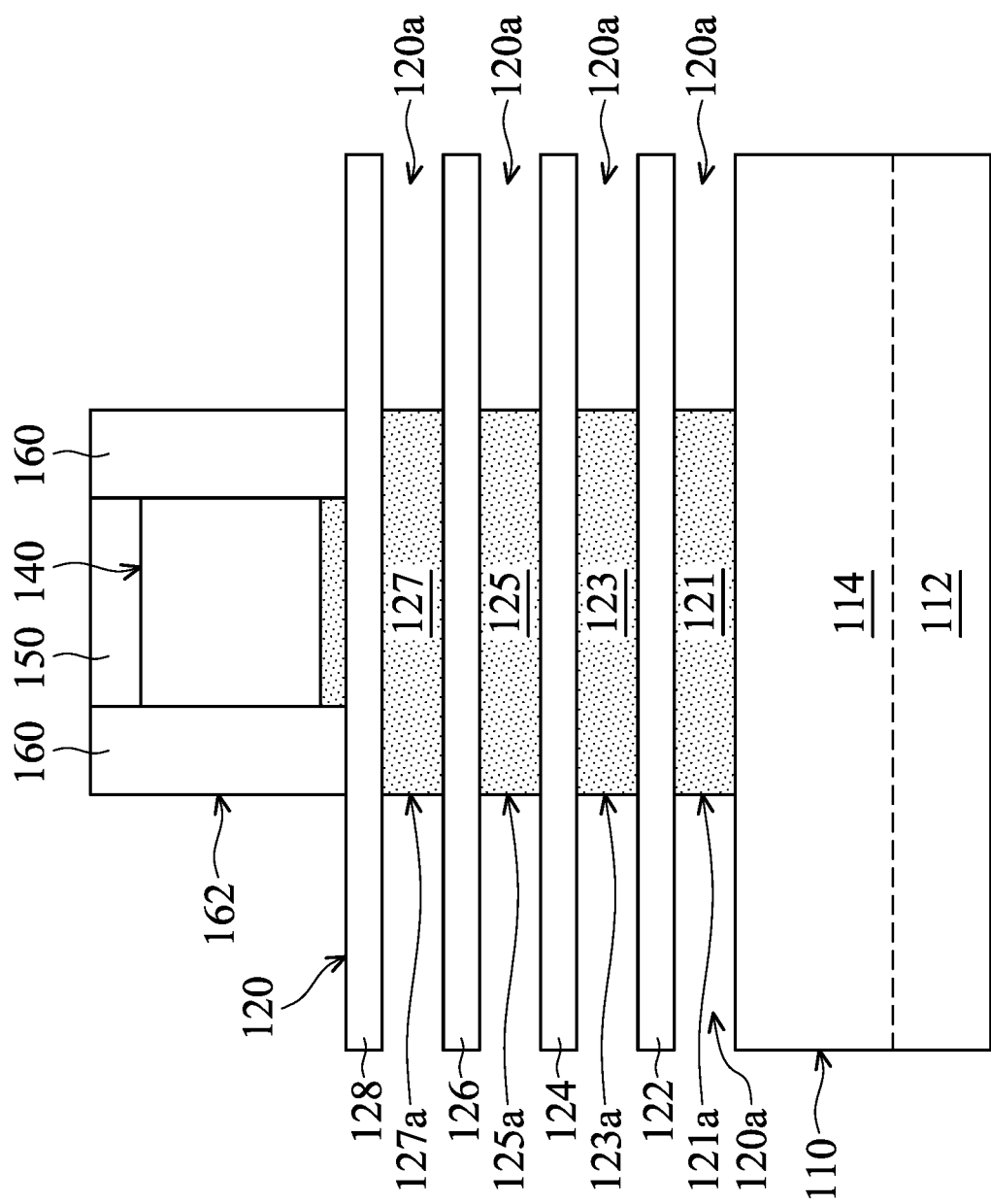

As shown in FIG. 1D, end portions of the nanostructures 121, 123, 125 and 127, which are not covered by the gate stack 140 and the spacer structure 160, are removed, in accordance with some embodiments. The removal process forms trenches 120*a* in the nanostructure stack 120, in accordance with some embodiments.

As shown in FIG. 1D, sidewalls 121*a*, 123*a*, 125*a* and 127*a* of the nanostructures 121, 123, 125 and 127 are substantially aligned with (or substantially coplanar with) sidewalls 162 of the spacer structure 160, in accordance with some embodiments. The removal process includes an etching process, in accordance with some embodiments. The etching process includes an anisotropic etching process such as a dry etching process, in accordance with some embodiments.

Figure 1E:
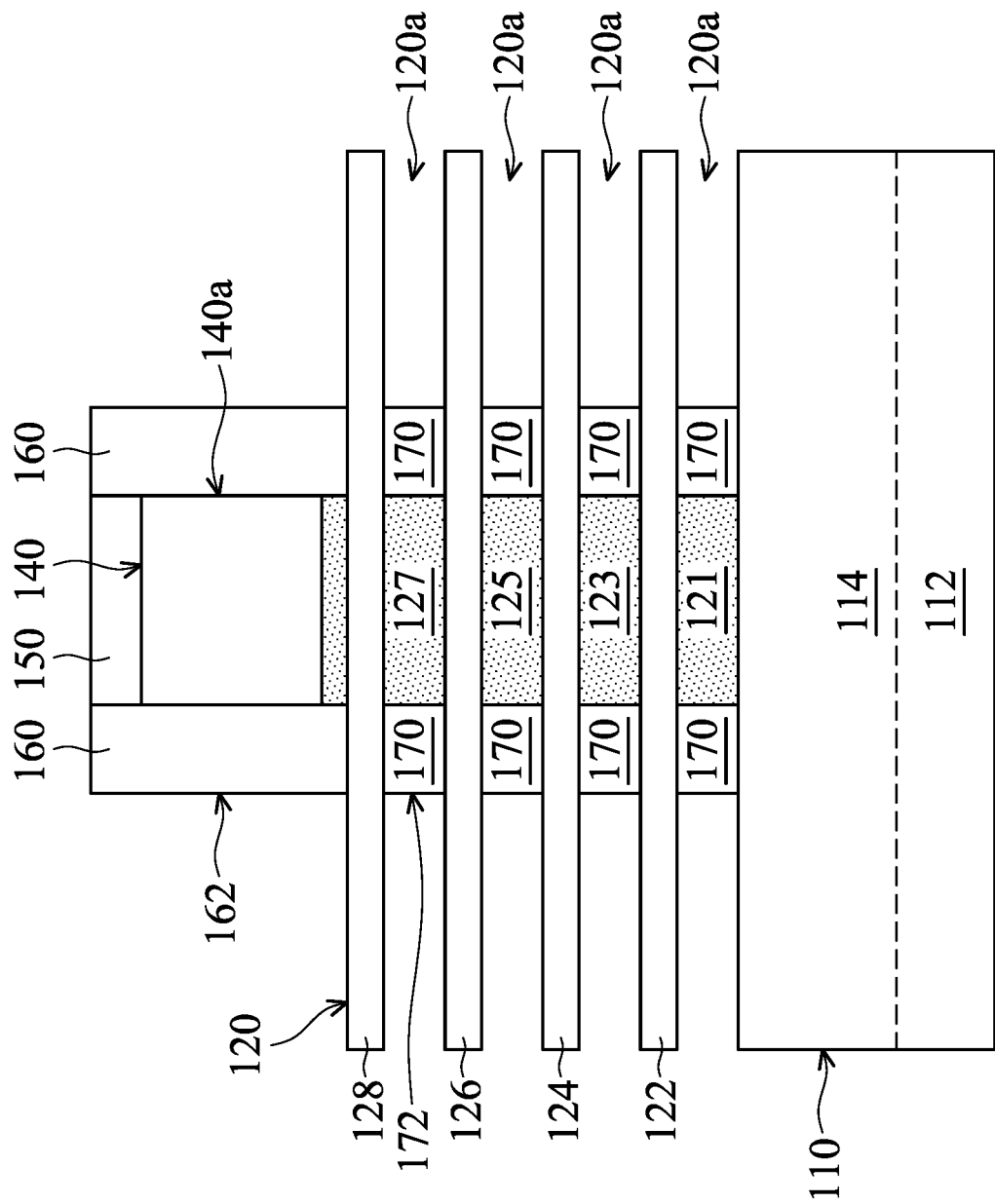

As shown in FIG. 1E, end portions of the nanostructures 121, 123, 125 and 127 are oxidized into an oxide layer, in accordance with some embodiments. The oxide layer forms an inner spacer layer 170, in accordance with some embodiments. As shown in FIG. 1E, sidewalls 172 of the inner spacer layer 170 are substantially aligned with (or substantially coplanar with) the sidewalls 162 of the spacer structure 160, in accordance with some embodiments.

Since the inner spacer layer 170 is formed by oxidizing the end portions of the nanostructures 121, 123, 125 and 127, the inner spacer layer 170 includes an oxide of a material of the nanostructures 121, 123, 125 and 127, in accordance with some embodiments. For example, the nanostructures 121, 123, 125 and 127 are made of SiGe, and the inner spacer layer 170 includes SiGe oxide. For another example, the nanostructures 121, 123, 125 and 127 are made of Si, and the inner spacer layer 170 includes silicon oxide.

The inner spacer layer 170 includes an oxide material, such as a semiconductor oxide (e.g., silicon oxide), a compound semiconductor oxide (e.g., silicon carbide oxide or gallium arsenide oxide), a metal oxide (e.g., germanium oxide), an alloy semiconductor oxide (e.g., silicon germanium oxide), or a combination thereof, in accordance with some embodiments. The oxidization process includes a thermal oxidation process, in accordance with some embodiments.

In some other embodiments, the inner spacer layer 170 is formed using a deposition process and an etching process. The deposition process includes a physical vapor deposition process, a chemical vapor deposition process, an atomic layer deposition process, or the like, in accordance with some embodiments. In still other embodiments, the inner spacer layer 170 is formed using a selective deposition process such as an atomic layer deposition process.

Figure 1F:
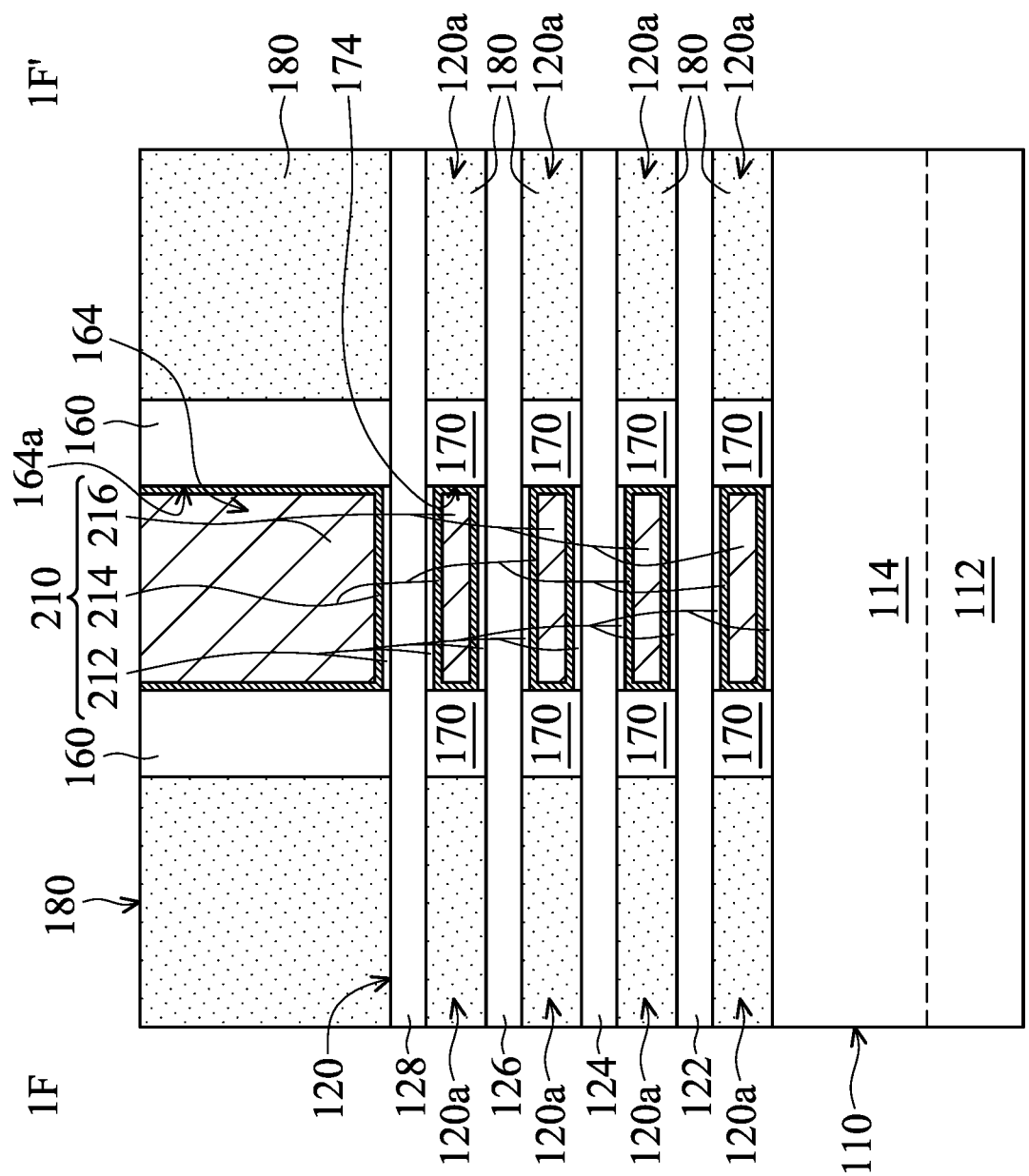
Figures 1, 1F:
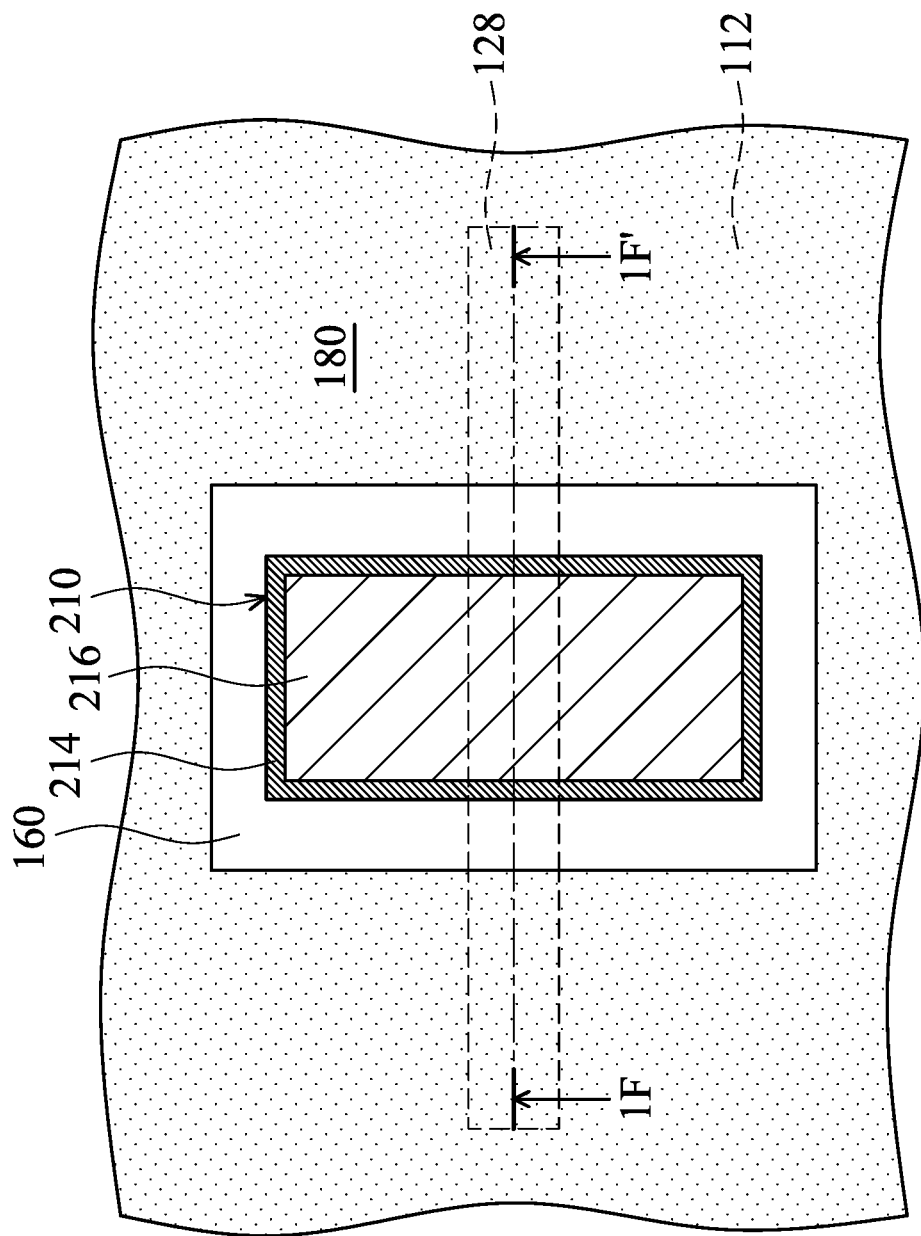

FIG. 1F-1 is a top view of the semiconductor device structure of FIG. 1F, in accordance with some embodiments. FIG. 1F is a cross-sectional view illustrating the semiconductor device structure along a sectional line 1F-1F' in FIG. 1F-1, in accordance with some embodiments.

As shown in FIGS. 1E, 1F and 1F-1, a dielectric layer 180 is formed over the substrate 110, in accordance with some embodiments. The nanostructure stack 120, the gate stack 140, the mask layer 150, the spacer structure 160, and the inner spacer layer 170 are embedded in the dielectric layer 180, in accordance with some embodiments. The dielectric layer 180 surrounds the nanostructures 122, 124, 126 and 128, the spacer structure 160, and the inner spacer layer 170, in accordance with some embodiments.

The dielectric layer 180 includes a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 180 is formed by a deposition process (e.g., a chemical vapor deposition process) and a planarization process (e.g., a chemical mechanical polishing process), in accordance with some embodiments.

As shown in FIGS. 1E, 1F and 1F-1, the gate stack 140 and the mask layer 150 are removed, in accordance with some embodiments. The removal process forms a trench 164 in the spacer structure 160, in accordance with some embodiments. As shown in FIGS. 1E, 1F and 1F-1, the nanostructures 121, 123, 125 and 127 are removed through the trench 164, in accordance with some embodiments. The removal process for removing the gate stack 140, the mask layer 150 and the nanostructures 121, 123, 125 and 127 includes an etching process such as a wet etching process or a dry etching process, in accordance with some embodiments.

As shown in FIGS. 1F and 1F-1, a gate stack 210 is formed in the trench 164, in accordance with some embodiments. The gate stack 210 surrounds the nanostructures 122, 124, 126 and 128, in accordance with some embodiments. The nanostructures 122, 124, 126 and 128 pass through the gate stack 210, the inner spacer layer 170, and the dielectric layer 180, in accordance with some embodiments. The gate stack 210 includes a gate dielectric layer 212, a work function metal layer 214, and a gate electrode layer 216, in accordance with some embodiments.

The gate dielectric layer 212 conformally covers the fin 114 and the nanostructures 122, 124, 126 and 128, in accordance with some embodiments. The gate dielectric layer 212 is made of an oxide material, such as silicon oxide or germanium oxide, in accordance with some embodiments. The gate dielectric layer 212 is formed using an oxidation process or another suitable process.

In some other embodiments, the gate dielectric layer 212 is made of a high-K material, such as $HfO_2$, $La_2O_3$, CaO, $ZrO_2$, $HfZrO_2$, or $Al_2O_3$, in accordance with some embodiments. The term "high-k material" means a material having a dielectric constant greater than the dielectric constant of silicon dioxide, in accordance with some embodiments. The gate dielectric layer 212 is formed using a selective deposition process, such as an atomic layer deposition process, or another suitable process. Therefore, the gate dielectric layer 212 is selectively deposited on the fin 114 and the nanostructures 122, 124, 126 and 128, though the present invention is not limited thereto. In some other embodiments (not shown), the gate dielectric layer 212 is conformally formed over the fin 114, the nanostructures 122, 124, 126 and 128, inner walls 164a of the trench 164, and sidewalls 174 of the inner spacer layer 170. The gate dielectric layer 212 is formed using a chemical vapor deposition process or a physical vapor deposition process, in accordance with some embodiments.

The work function metal layer 214 is conformally formed over the gate dielectric layer 212, the spacer structure 160, and the inner spacer layer 170, in accordance with some embodiments. The work function metal layer 214 is made of titanium-containing material (e.g., TiN or TiSiN), tantalum-containing material (e.g., TaN), or another suitable conductive material. The work function metal layer 214 is formed using an atomic layer deposition process or another suitable process.

The gate electrode layer 216 is formed over the work function metal layer 214, in accordance with some embodiments. The gate electrode layer 216 is made of metal (e.g., W, Al, Ta, Ti, or Au), metal nitride (TiN or TaN), or another suitable conductive material. The gate electrode layer 216 is formed using a deposition process (e.g., an atomic layer deposition process, a physical vapor deposition process, or a chemical vapor deposition process) and a chemical mechanical polishing process, in accordance with some embodiments.

Figure 1G:
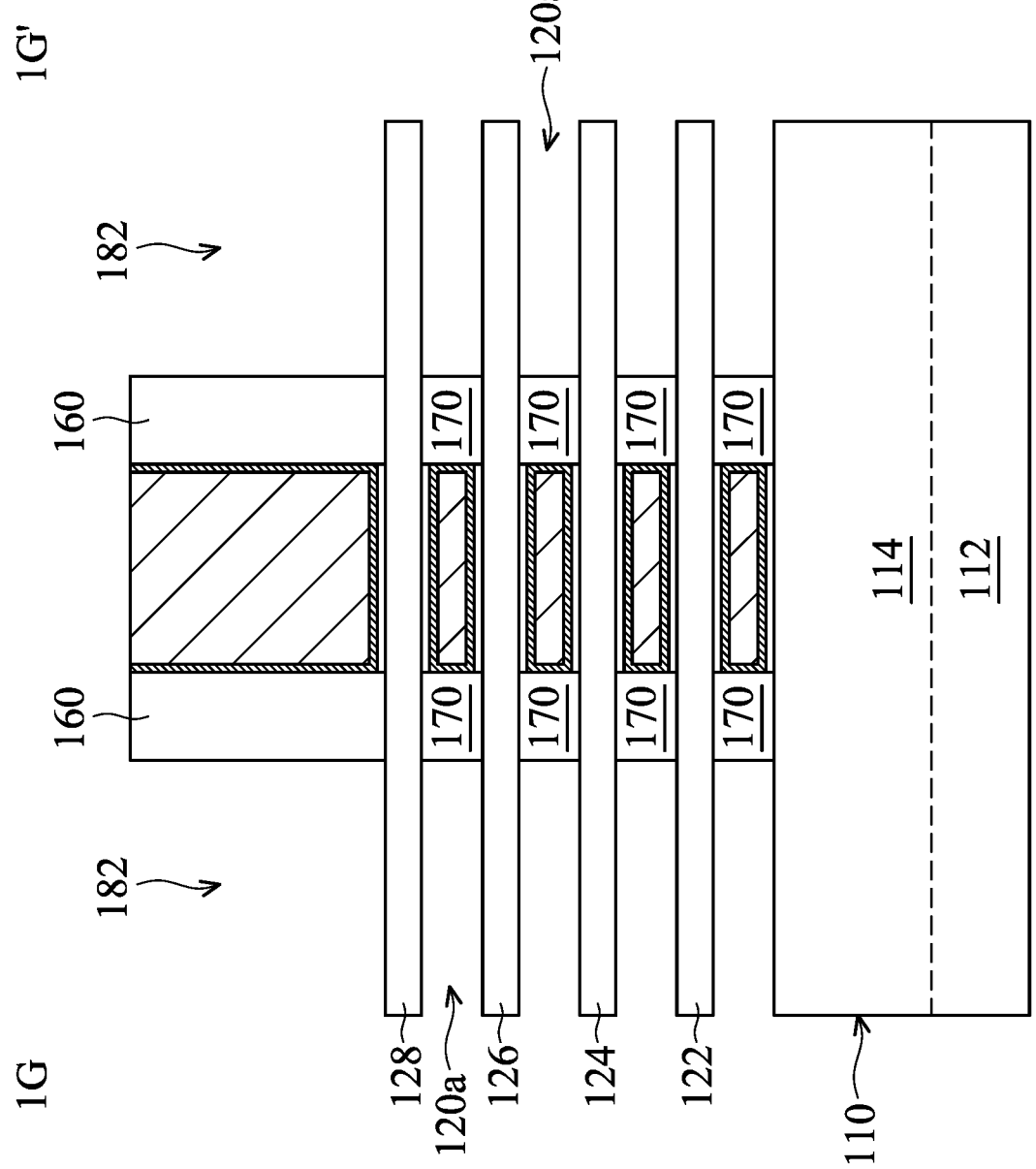
Figures 1, 1G:
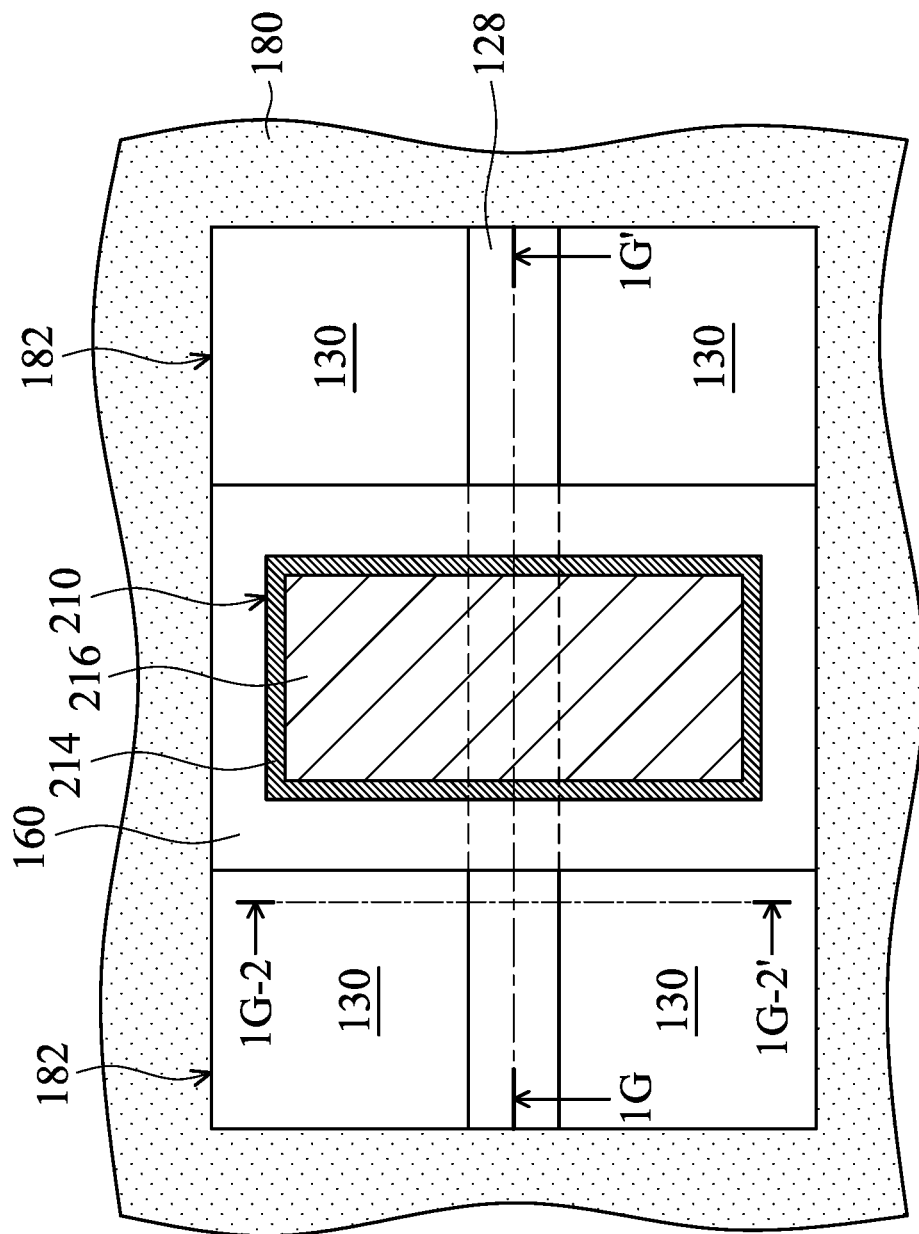
Figures 1, 1G, 2:
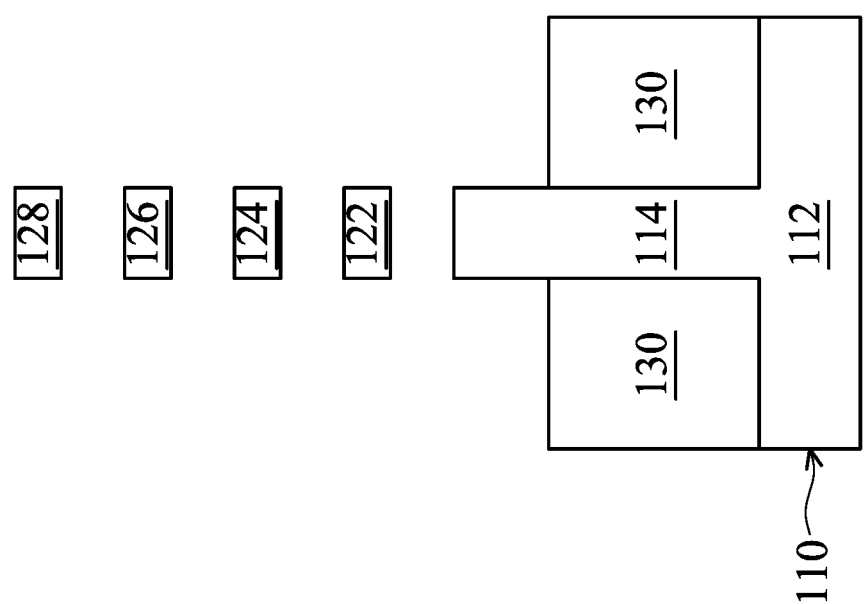

FIG. 1G-1 is a top view of the semiconductor device structure of FIG. 1G, in accordance with some embodiments. FIG. 1G is a cross-sectional view illustrating the semiconductor device structure along a sectional line 1G-1G' in FIG. 1G-1, in accordance with some embodiments. FIG. 1G-2 is a cross-sectional view illustrating the semiconductor device structure along a sectional line 1G-2-1G-2' in FIG. 1G-1, in accordance with some embodiments.

As shown in FIGS. 1G, 1G-1 and 1G-2, portions of the dielectric layer 180 are removed to form through holes 182 in the dielectric layer 180, in accordance with some embodiments. Each through hole 182 exposes end portions of the nanostructures 122, 124, 126 and 128 and an upper portion of the fin 114, in accordance with some embodiments. Each through hole 182 further exposes a portion of the isolation layer 130, in accordance with some embodiments. The removal process includes an etching process such as an anisotropic etching process (e.g., a dry etching process), in accordance with some embodiments.

Figures 1, 1H:
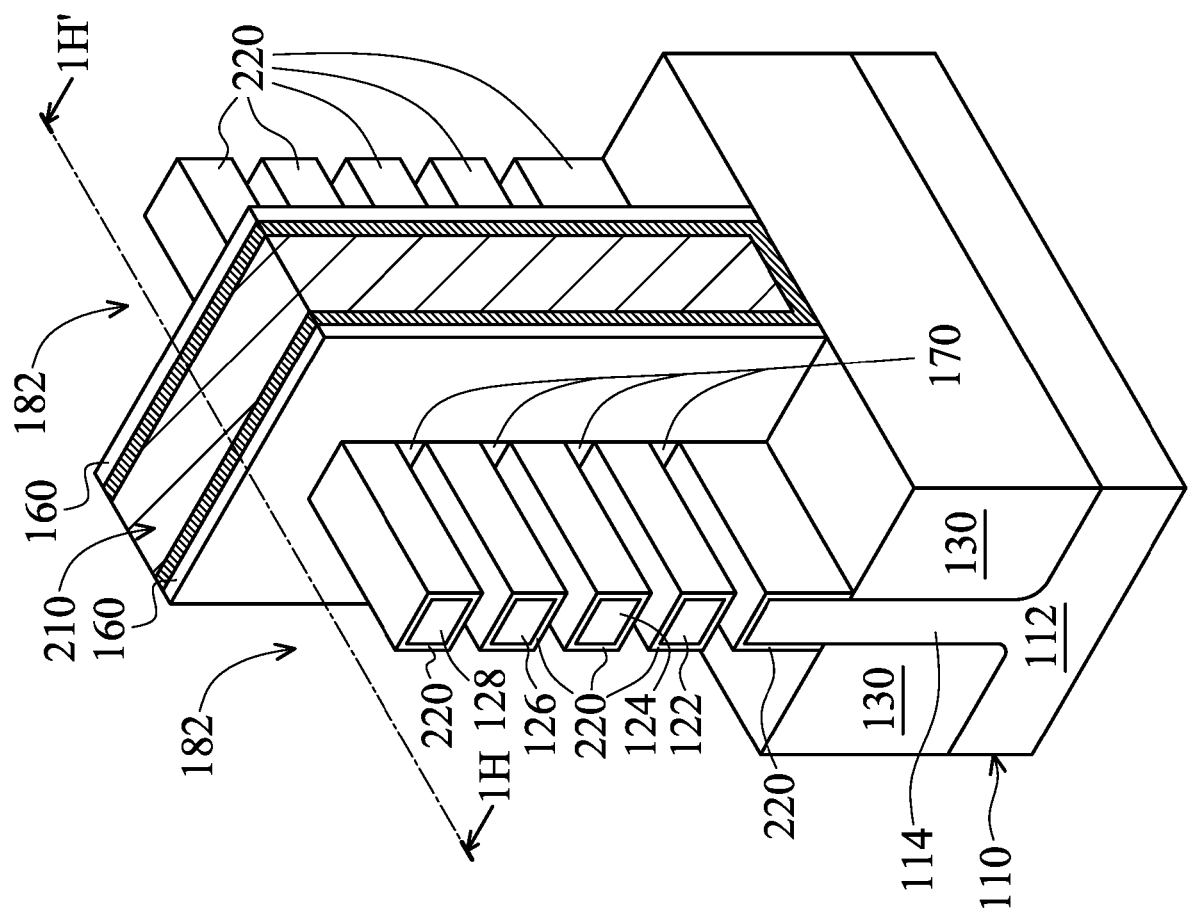

FIG. 1H-1 is a perspective view of the semiconductor device structure of FIG. 1H, in accordance with some embodiments. FIG. 1H is a cross-sectional view illustrating the semiconductor device structure along a sectional line 1H-1H' in FIG. 1H-1, in accordance with some embodiments.

As shown in FIGS. 1H and 1H-1, source/drain layers 220 are formed in through holes 182, in accordance with some embodiments. The source/drain layers 220 are also referred to as stressor layers, in accordance with some embodiments. The source/drain layers 220 respectively surround the end portions of the nanostructures 122, 124, 126 and 128 and the upper portion of the fin 114, in accordance with some embodiments. The source/drain layers 220 are in direct contact with the nanostructures 122, 124, 126 and 128 and the fin 114 respectively, in accordance with some embodiments.

The trench 120a has a width W1, in accordance with some embodiments. The source/drain layer 220 has a thickness T1, in accordance with some embodiments. In some embodiments, a ratio of the thickness T1 to the width W1 ranges from about 0.15 to about 0.4. If the ratio (T1/W1) is less than 0.15, the source/drain layer 220 may be too thin to apply enough stress to the channel region of the nanostructure 122, 124, 126 or 128. If the ratio (T1/W1) is greater than 0.4, the gap G between the source/drain layers 220 may be too narrow to accommodate silicide layers and a contact structure subsequently formed therein.

In some embodiments, the source/drain layers 220 are made of a semiconductor material (e.g., silicon germanium). In some embodiments, the source/drain layers 220 are in-situ doped with P-type dopants. In some other embodiments, the source/drain layers 220 are implanted with P-type dopants. The P-type dopants include the Group IIIA element, in accordance with some embodiments. The Group IIIA element includes boron or another suitable material.

In some other embodiments, the source/drain layers 220 are made of a semiconductor material (e.g., silicon). In some embodiments, the source/drain layers 220 are in-situ doped with N-type dopants. In some other embodiments, the source/drain layers 220 are implanted with N-type dopants. The N-type dopants include the Group VA element, in accordance with some embodiments. The Group VA element includes phosphor (P), antimony (Sb), or another suitable Group VA material. The source/drain layers 220 are formed using an epitaxial process, in accordance with some embodiments.

Figure 1I:
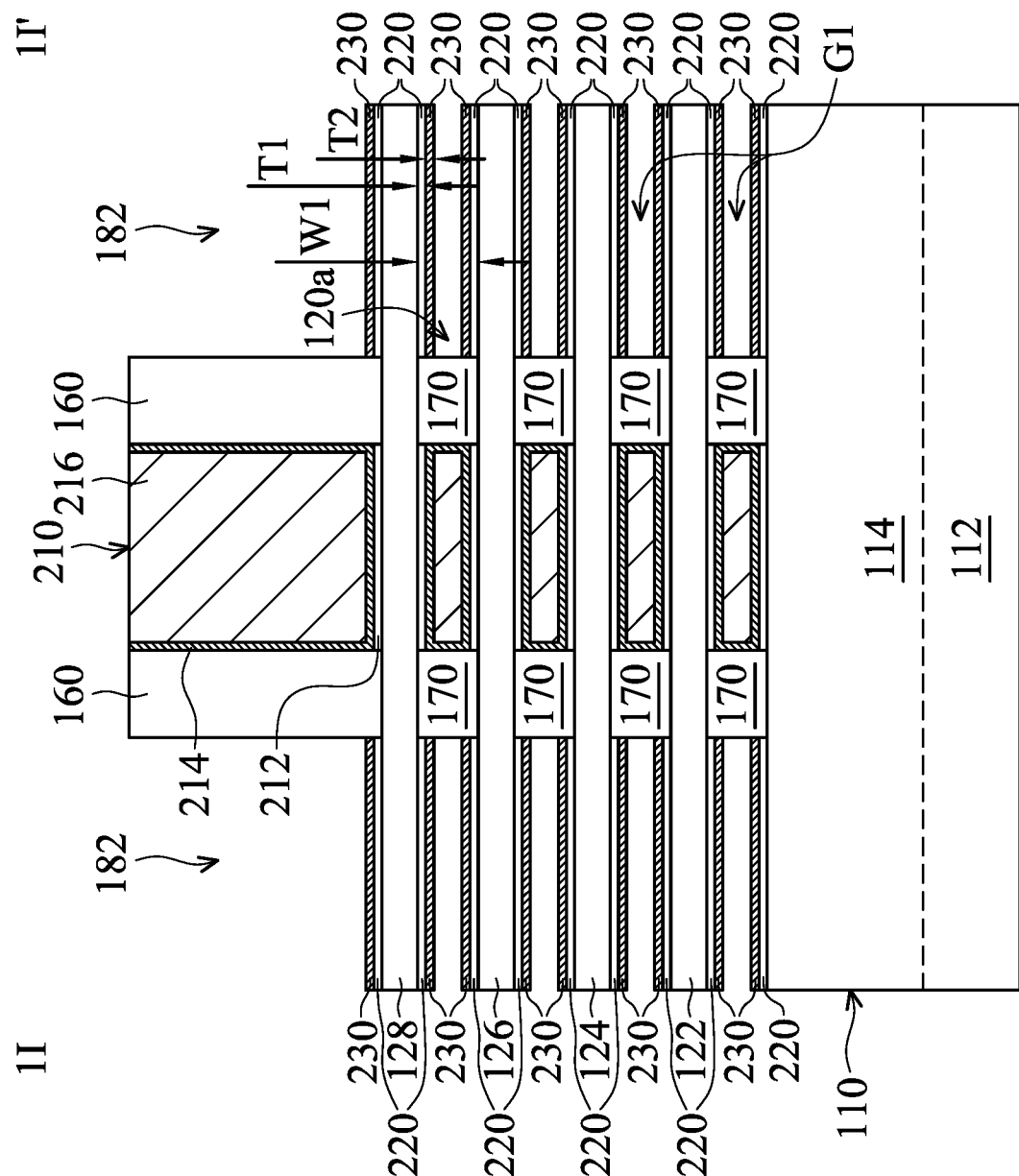
Figures 1, 1I:
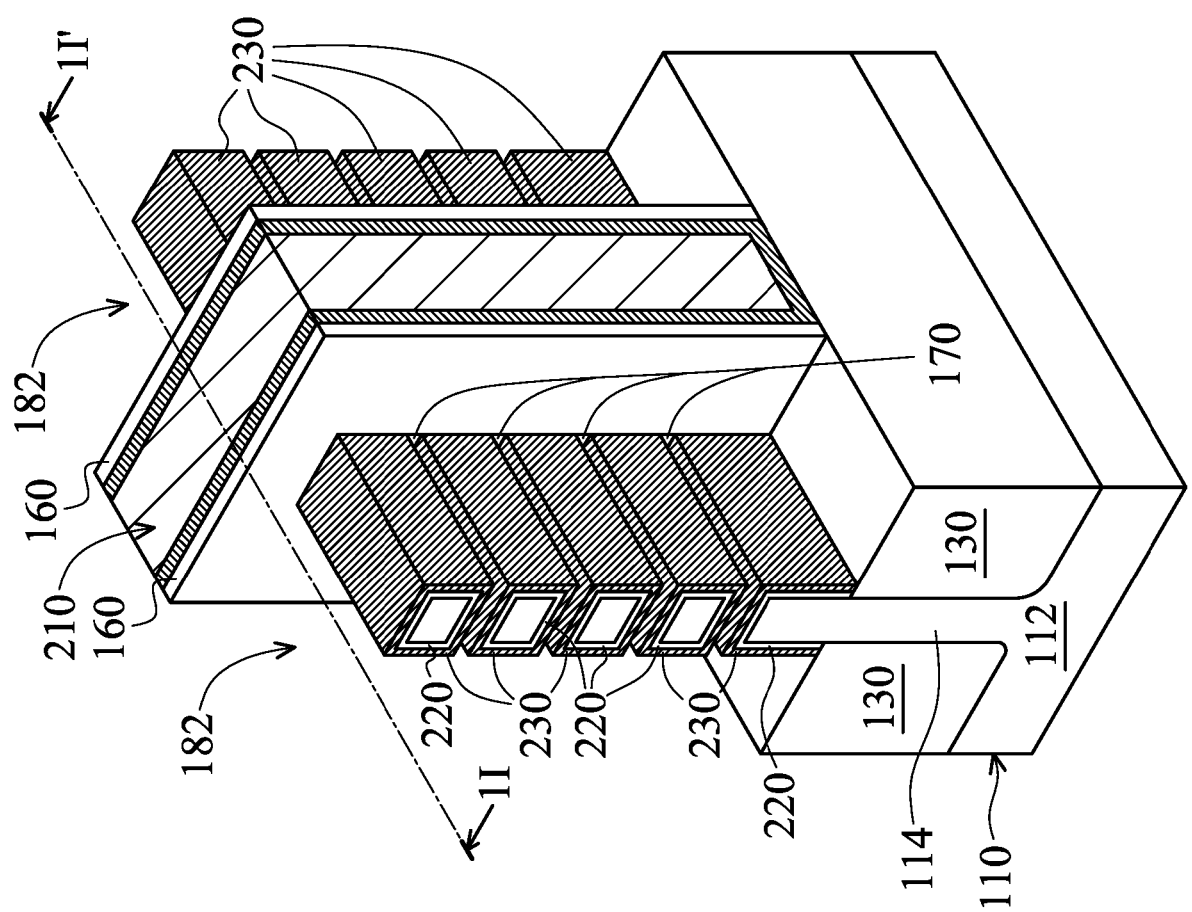

FIG. 1I-1 is a perspective view of the semiconductor device structure of FIG. 1I, in accordance with some embodiments. FIG. 1I is a cross-sectional view illustrating the semiconductor device structure along a sectional line 1I-1I' in FIG. 1I-1, in accordance with some embodiments.

As shown in FIGS. 1I and 1I-1, silicide layers 230 are formed over the source/drain layers 220 respectively, in accordance with some embodiments. Each silicide layer 230 surrounds the corresponding source/drain layer 220 and the corresponding nanostructure (e.g., the nanostructure 122, 124, 126 or 128) or the upper portion of the fin 114, in accordance with some embodiments. The silicide layer 230 is thinner than the source/drain layer 220, in accordance with some embodiments. That is, the thickness T2 of the silicide layer 230 is less than the thickness T1 of the source/drain layer 220, in accordance with some embodiments.

In some embodiments, a ratio of the thickness T2 to the width W1 ranges from about 0.08 to 0.16. If the ratio (T2/W1) is less than 0.08, the silicide layer 230 may be too thin to reduce the resistance between the source/drain layer 220 and a contact structure subsequently formed thereover. If the ratio (T2/W1) is greater than 0.16, the gap G1 between the silicide layers 230 may be too narrow to accommodate the contact structure subsequently formed therein.

The silicide layer 230 is made of a metal silicide material, such as titanium silicide ($TiSi_2$), tungsten silicide ($WSi_2$), cobalt silicide ($CoSi_2$), molybdenum silicide ($MoSi_2$), or tantalum silicide ($TaSi_2$), in accordance with some embodiments.

Figure 1J:
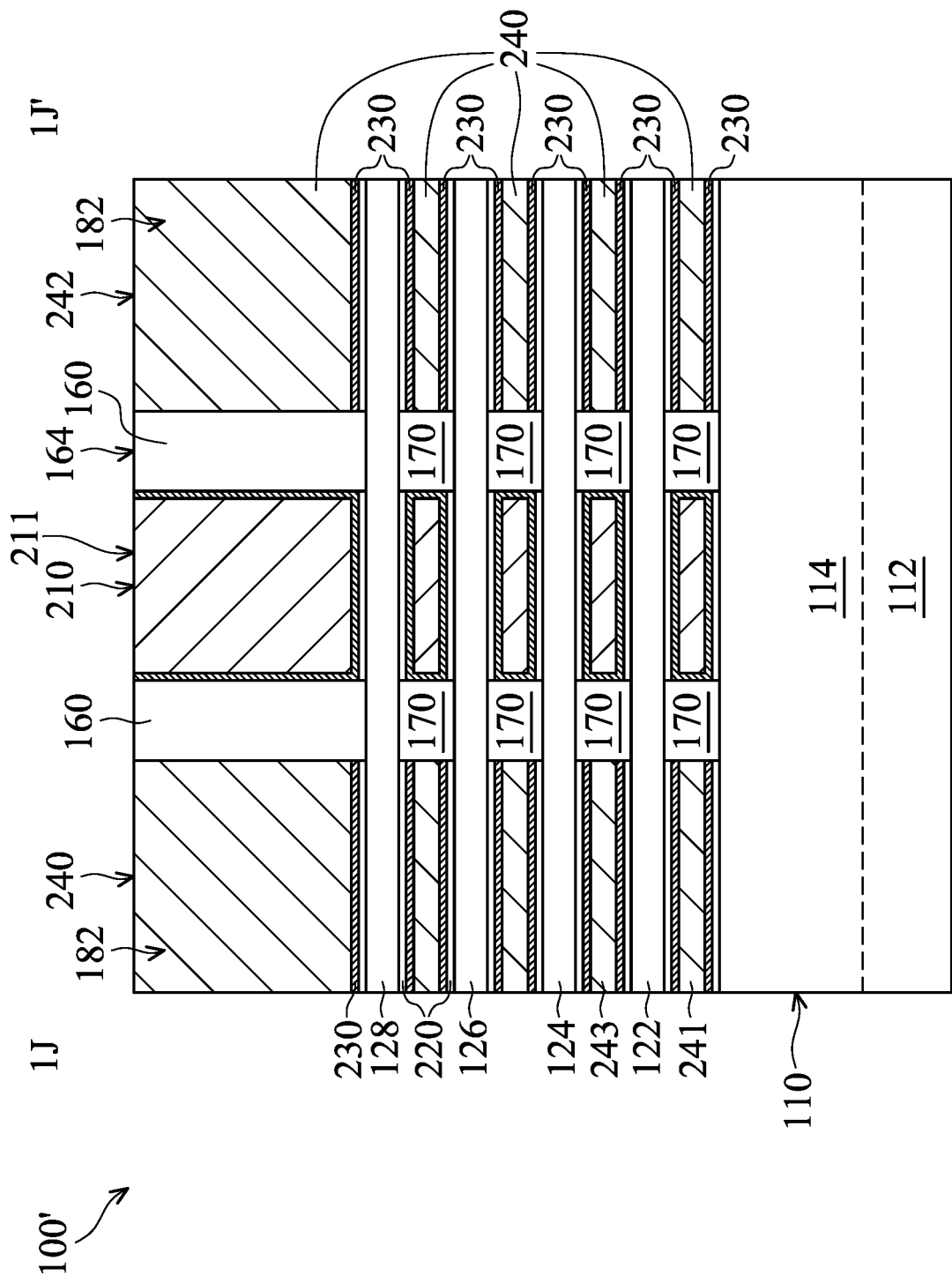
Figures 1, 1J:
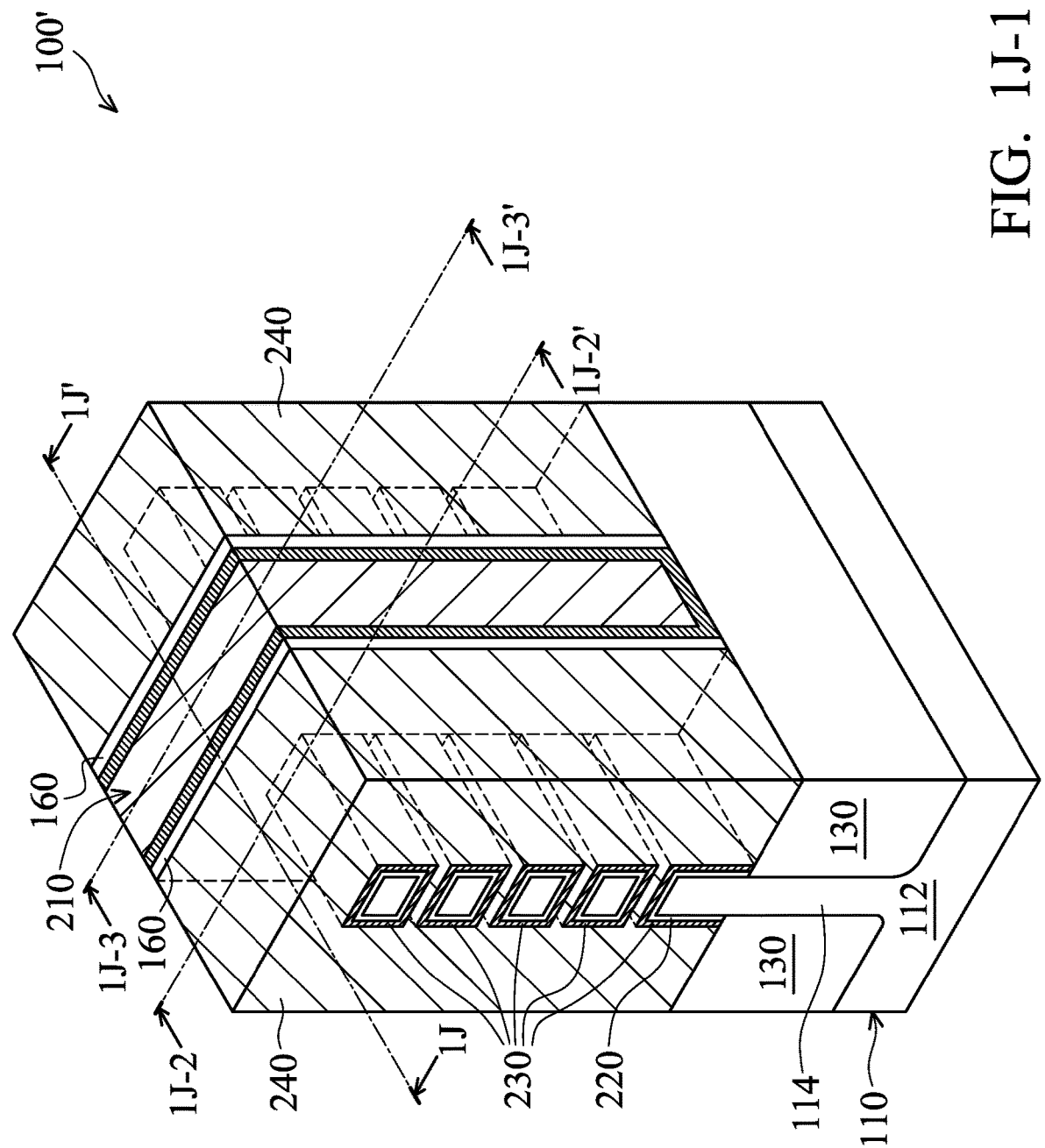

FIG. 1J-1 is a perspective view of the semiconductor device structure of FIG. 1J, in accordance with some embodiments. FIG. 1J is a cross-sectional view illustrating the semiconductor device structure along a sectional line 1J-1J' in FIG. 1J-1, in accordance with some embodiments.

FIG. 1J-2 is a cross-sectional view illustrating the semiconductor device structure along a sectional line 1J-2-1J-2' in FIG. 1J-1, in accordance with some embodiments. FIG. 1J-3 is a cross-sectional view illustrating the semiconductor device structure along a sectional line 1J-3-1J-3' in FIG. 1J-1, in accordance with some embodiments.

As shown in FIGS. 1J, 1J-1, 1J-2 and 1J-3, contact structures 240 are formed in the through holes 182, in accordance with some embodiments. Each contact structure 240 surrounds the nanostructures 122, 124, 126 and 128, in accordance with some embodiments. Each contact structure 240 also surrounds the corresponding source/drain layers 220 and the corresponding silicide layers 230, in accordance with some embodiments. Each contact structure 240 continuously surrounds the nanostructures 122, 124, 126 and 128, the corresponding source/drain layers 220, and the corresponding silicide layers 230, in accordance with some embodiments.

In some embodiments, a portion 241 of the contact structure 240 is between the source/drain layer 220 and the fin 114. In some embodiments, a portion 243 of the contact structure 240 is between the source/drain layers 220. The portion 241 or 243 is also between the silicide layers 230, in accordance with some embodiments.

Each contact structure 240 is in direct contact with the corresponding silicide layers 230, in accordance with some embodiments. As shown in FIG. 1J-1, each contact structure 240 is in direct contact with the isolation layer 130, in accordance with some embodiments.

The contact structures 240 are formed using a deposition process (e.g., a physical vapor deposition process) and a planarization process (e.g., a chemical mechanical polishing process), in accordance with some embodiments. The top surfaces 211, 164 and 242 of the gate stack 210, the spacer structure 160, and the contact structure 240 are substantially coplanar, in accordance with some embodiments. In this step, a semiconductor device structure 100' is substantially formed, in accordance with some embodiments.

As shown in FIG. 1J-2, the nanostructures 122, 124, 126 and 128 are nanosheets, in accordance with some embodiments. The nanostructures 122, 124, 126 and 128 have a rectangular shape in the cross-sectional view, in accordance with some embodiments. In some other embodiments, as shown in FIG. 2, the nanostructures 122, 124, 126 and 128 are nanosheets with curved sidewalls 122a, 124a, 126a and 128a.

Figures 1, 1J, 2, 3:
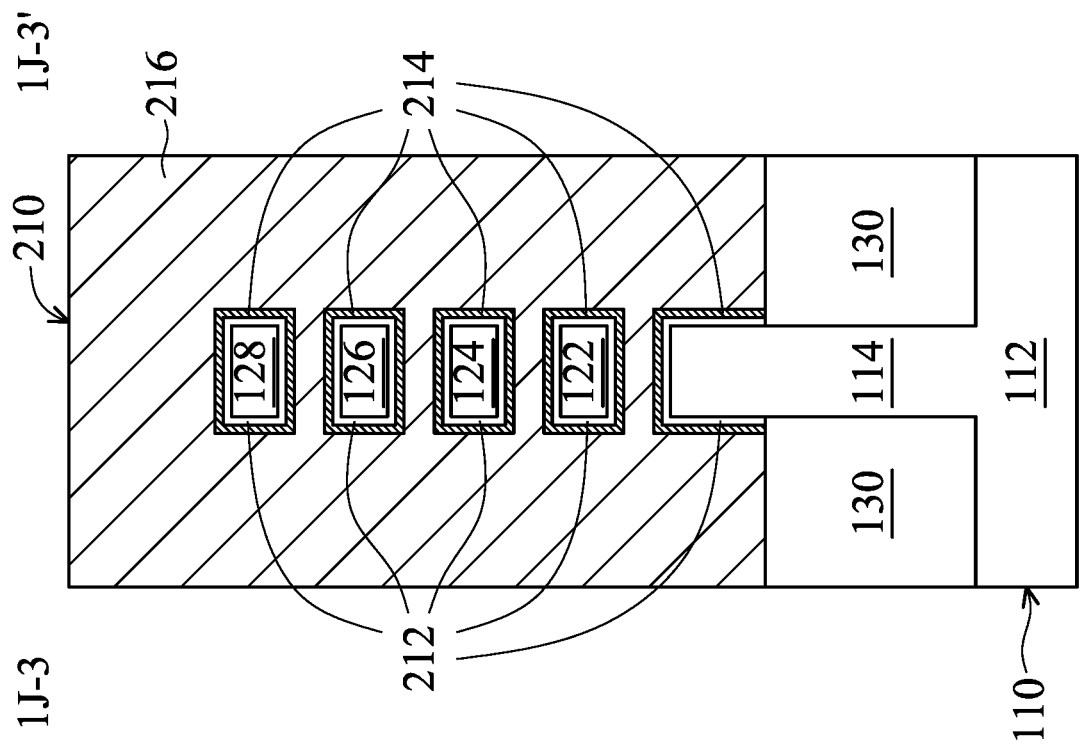
Figures 1, 1J, 2:
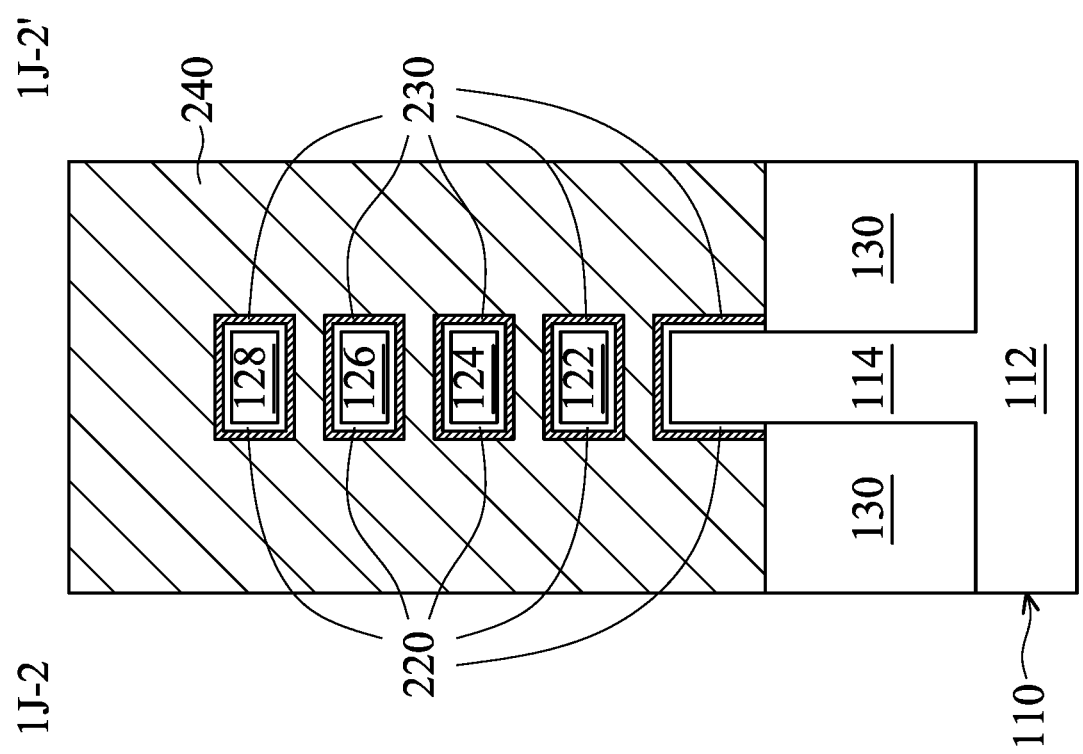
Figure 4:
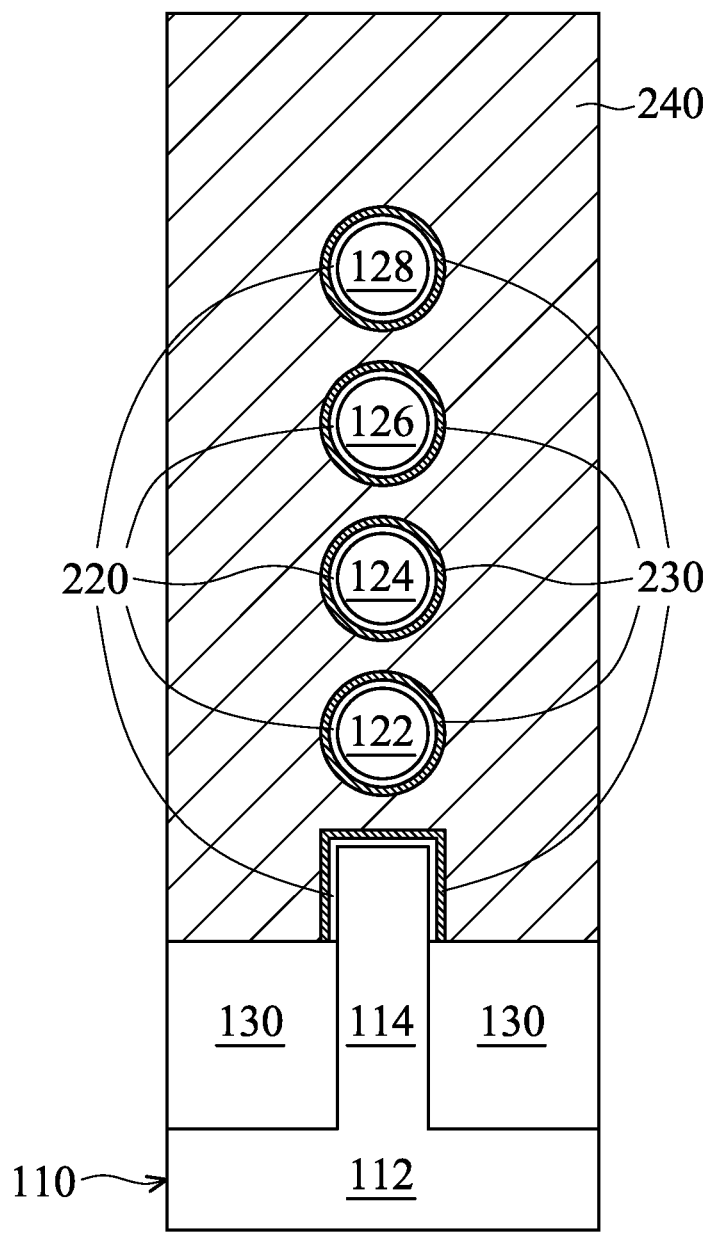
FIG. 4 is a cross-sectional view illustrating a semiconductor device structure, in accordance with some embodiments.

In still other embodiments, as shown in FIG. 3, the nanostructures 122, 124, 126 and 128 are nanosheets. The nanostructures 122, 124, 126 and 128 have a square shape, in accordance with some embodiments. In some other embodiments, as shown in FIG. 4, the nanostructures 122, 124, 126 and 128 are nanowires with a round shape.

Figure 1K:
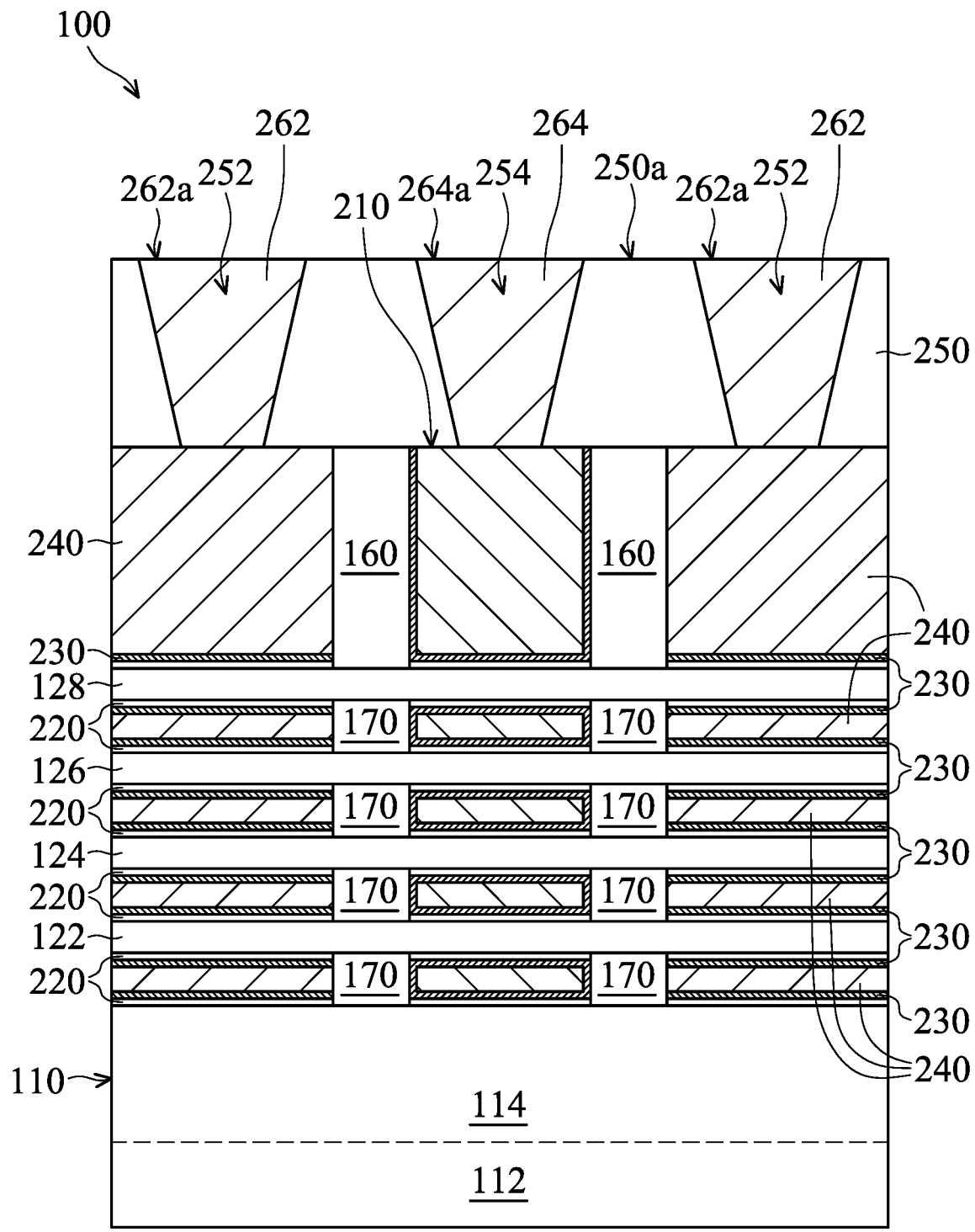
Figure 2:
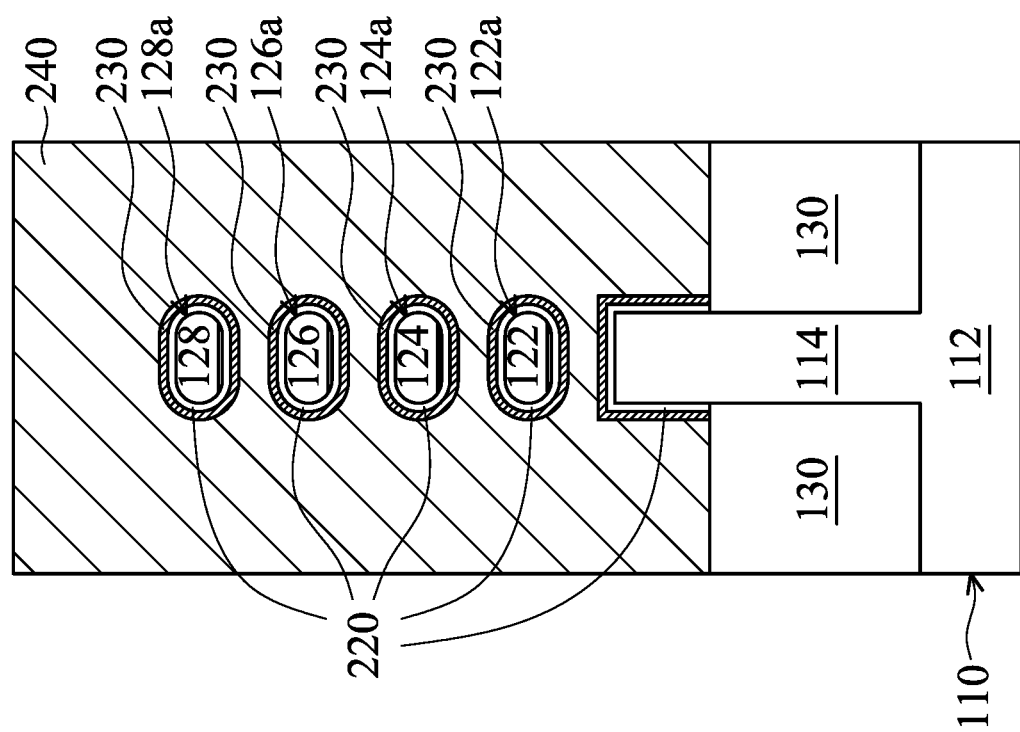
Figure 3:
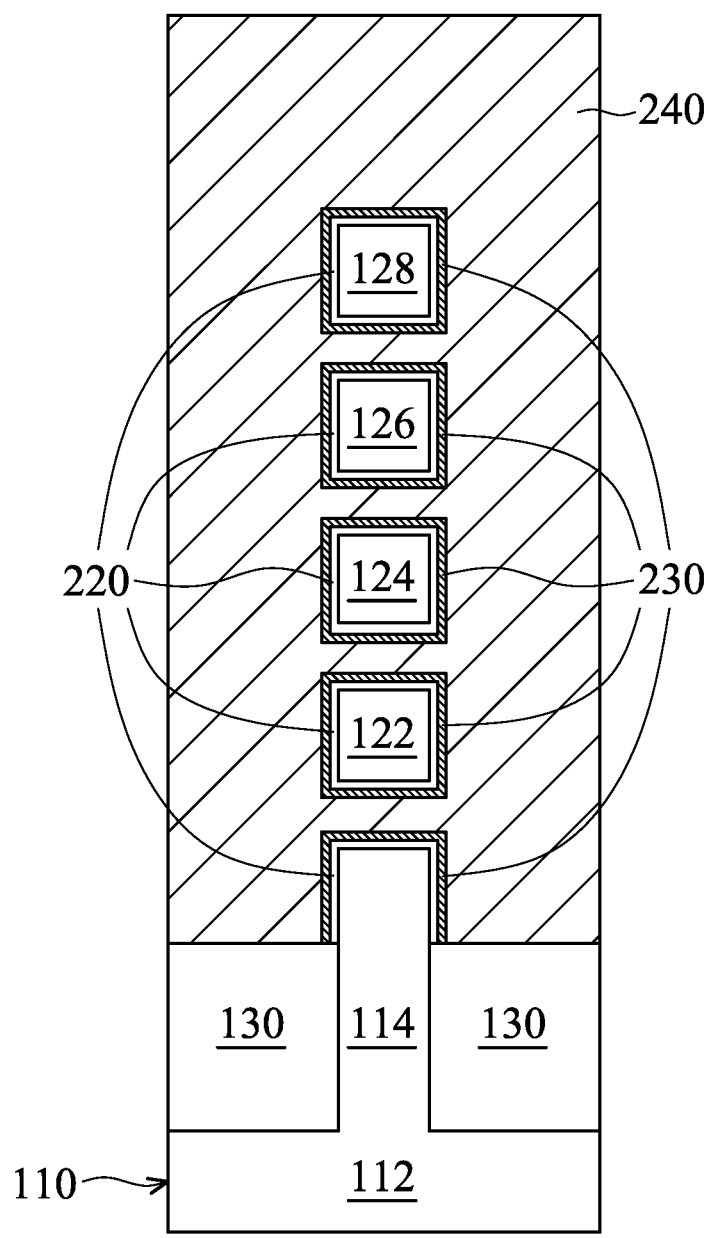

As shown in FIG. 1K, a dielectric layer 250 is formed over the contact structure 240, the spacer structure 160, the gate stack 210, and the dielectric layer 180 (as shown in FIG. 1G-1), in accordance with some embodiments. The dielectric layer 250 is made of a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 250 is formed by a deposition process (e.g., a chemical vapor deposition process) and a planarization process (e.g., a chemical mechanical polishing process), in accordance with some embodiments.

As shown in FIG. 1K, portions of the dielectric layer 250 are removed to form through holes 252 and 254 in the dielectric layer 250, in accordance with some embodiments. The through holes 252 expose the contact structures 240 thereunder, in accordance with some embodiments. The through hole 254 exposes the gate stack 210, in accordance with some embodiments. The removal process includes an etching process, such as a dry etching process, in accordance with some embodiments.

As shown in FIG. 1K, conductive structures 262 and 264 are formed in the through holes 252 and 254 respectively, in accordance with some embodiments. In this step, a semiconductor device structure 100 is substantially formed, in accordance with some embodiments. The conductive structures 262 are electrically connected to the contact structures 240 thereunder, in accordance with some embodiments. The conductive structure 264 is electrically connected to the gate stack 210, in accordance with some embodiments.

The conductive structures 262 and 264 are made of metal (e.g., tungsten, aluminum, or copper), alloys thereof, or the like, in accordance with some embodiments. The conductive structures 262 and 264 are formed using a deposition process (e.g., a physical vapor deposition process or a chemical vapor deposition process) and a planarization process (e.g., a chemical mechanical polishing process), in accordance with some embodiments. The top surfaces 250a, 262a and 264a of the dielectric layer 250 and the conductive structures 262 and 264 are substantially coplanar, in accordance with some embodiments.

While the semiconductor device structure 100 is in operation, the current is applied into the nanostructures 122, 124, 126 and 128 from the contact structures 240, in accordance with some embodiments. The current flowing through the nanostructure is negatively related to a distance between the nanostructure and the contact structure, in accordance with some embodiments. Since the contact structure 240 surrounds the nanostructures 122, 124, 126 and 128, the distances between the nanostructures 122, 124, 126 and 128 and the contact structure 240 are substantially the same, in accordance with some embodiments. Therefore, the currents flowing through the nanostructures 122, 124, 126 and 128 are substantially the same, in accordance with some embodiments. As a result, the uniformity in current flowing through the nanostructures 122, 124, 126 and 128 is improved, in accordance with some embodiments. Therefore, the performance of the semiconductor device structure 100 is improved, in accordance with some embodiments.

Figure 5:
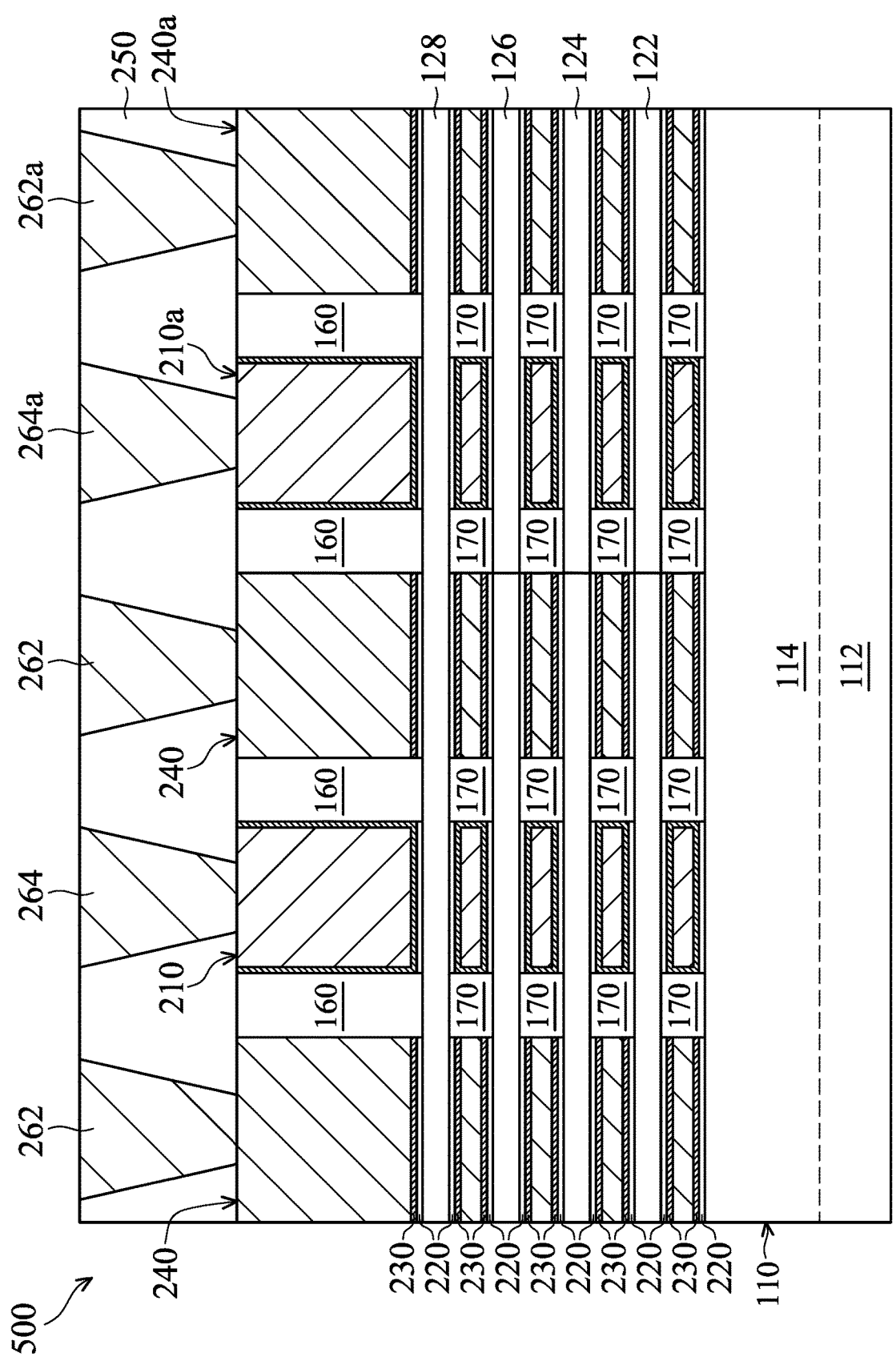
FIG. 5 is a cross-sectional view illustrating a semiconductor device structure, in accordance with some embodiments.

FIG. 5 is a cross-sectional view illustrating a semiconductor device structure 500, in accordance with some embodiments. As shown in FIG. 5, the semiconductor device structure 500 is similar to the semiconductor device structure 100, except that the semiconductor device structure 500 further includes a gate stack 210a, a contact structure 240a, and conductive structures 262a and 264a, in accordance with some embodiments.

The gate stack 210a is between the contact structures 240 and 240a, in accordance with some embodiments. The gate stack 210a surrounds the nanostructures 122, 124, 126 and 128, in accordance with some embodiments. The contact structure 240a continuously surrounds the nanostructures 122, 124, 126 and 128, the corresponding source/drain layers 220, and the corresponding silicide layers 230, in accordance with some embodiments.

The conductive structures 262a and 264a passes through the dielectric layer 250, in accordance with some embodiments. The conductive structures 262a and 264a are electrically connected to the contact structure 240a and the gate stack 210a respectively, in accordance with some embodiments.

Figure 6A:
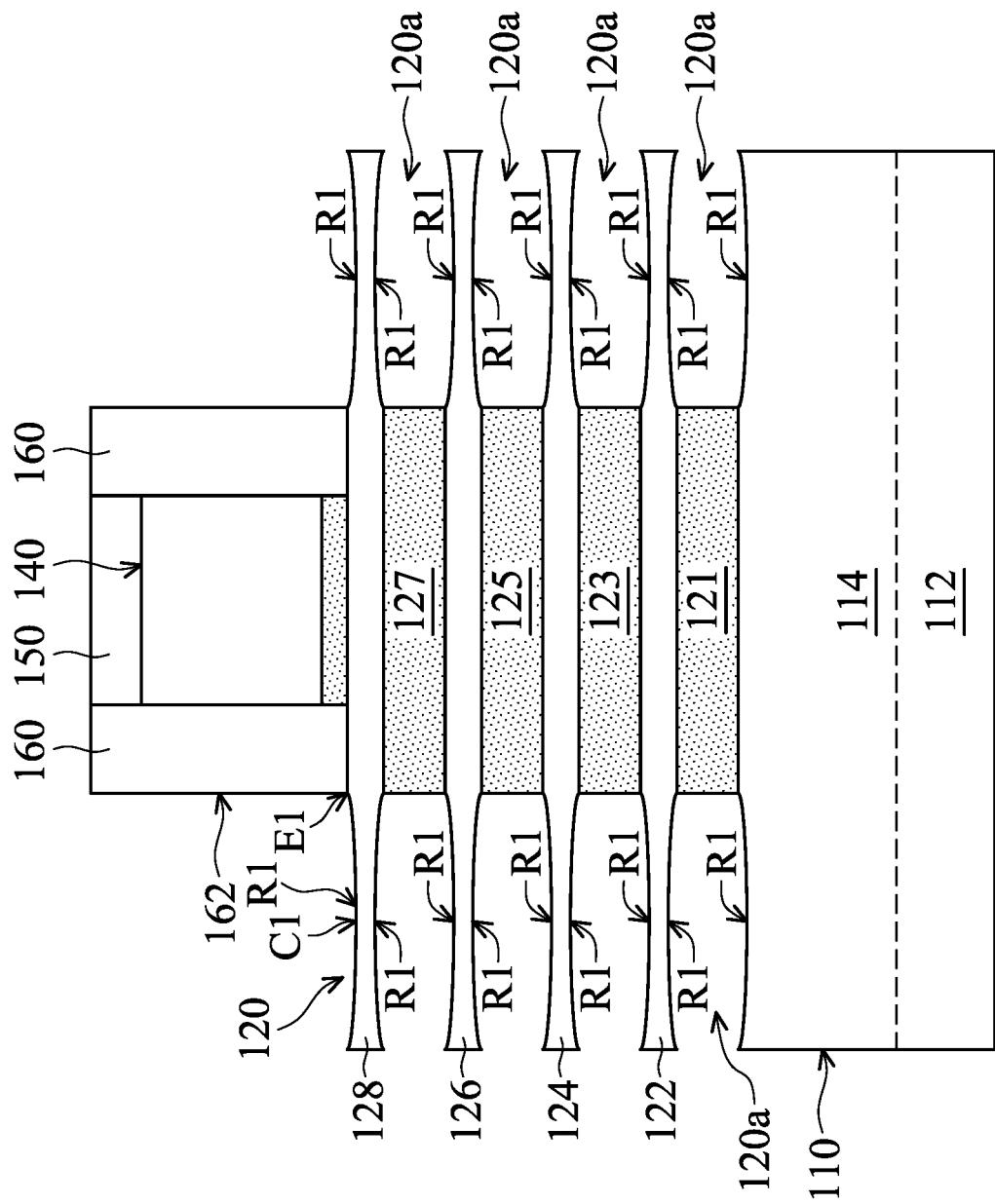
FIGS. 6A-6D are cross-sectional views of various steps of a process for forming a semiconductor device structure, in accordance with some embodiments.

FIGS. 6A-6D are cross-sectional views of various steps of a process for forming a semiconductor device structure, in accordance with some embodiments. As shown in FIG. 6A, after the steps of FIGS. 1A-1D, the nanostructures 122, 124, 126 and 128 and the fin 114 exposed by the gate stack 140 and the spacer structure 160 are partially removed during removing the end portions of the nanostructures 121, 123, 125 and 127, in accordance with some embodiments. Therefore, recesses R1 are formed in the nanostructures 122, 124, 126 and 128 and the fin 114, in accordance with some embodiments.

The recesses R1 are curved recesses, in accordance with some embodiments. The nanostructure 122, 124, 126 or 128 adjacent to a central portion C1 of the corresponding recess R1 is thinner than the nanostructure 122, 124, 126 or 128 adjacent to an edge portion E1 of the corresponding recess R1, in accordance with some embodiments.

The depths of the recesses R1 are adjustable by adjusting the etching selectivity between the nanostructure 122, 124, 126 or 128 and the nanostructures 121, 123, 125 and 127, in accordance with some embodiments. The formation of the recesses R1 may increase the contact area between a silicide layer and a contact structure subsequently formed thereover, which may decrease the resistance between the silicide layer and the contact structure.

Figure 6B:
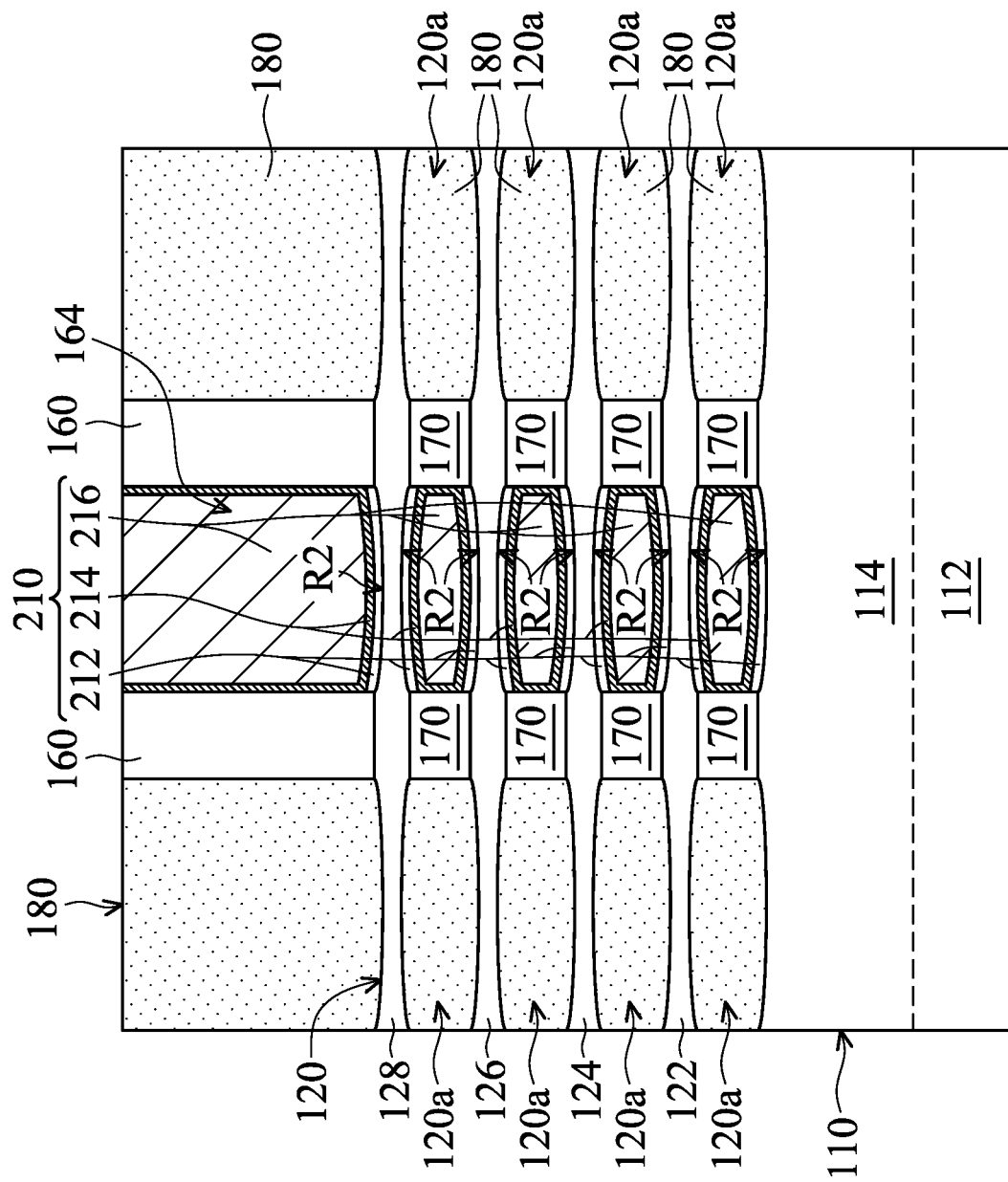

As shown in FIG. 6B, the steps of FIGS. 1E and 1F are performed to form the inner spacer layer 170 and the dielectric layer 180, to remove the gate stack 140, the mask layer 150, and the nanostructures 121, 123, 125 and 127, and to form the gate stack 210, in accordance with some embodiments.

The nanostructures 122, 124, 126 and 128 originally under the gate stack 140 are partially removed during removing the gate stack 140, the mask layer 150, and the nanostructures 121, 123, 125 and 127, in accordance with some embodiments. Therefore, recesses R2 are formed in the nanostructures 122, 124, 126 and 128 under the trench 164 of the spacer structure 160, in accordance with some embodiments.

The depths of the recesses R2 are adjustable by adjusting the etching selectivity between the nanostructure 122, 124, 126 or 128 and the nanostructures 121, 123, 125 and 127, in accordance with some embodiments. As shown in FIG. 6B, the gate stack 210 is partially in the recesses R2, in accordance with some embodiments. The gate dielectric layer 212 conformally covers the recesses R2, in accordance with some embodiments. The work function metal layer 214 conformally covers the gate dielectric layer 212, in accordance with some embodiments.

Figure 6C:
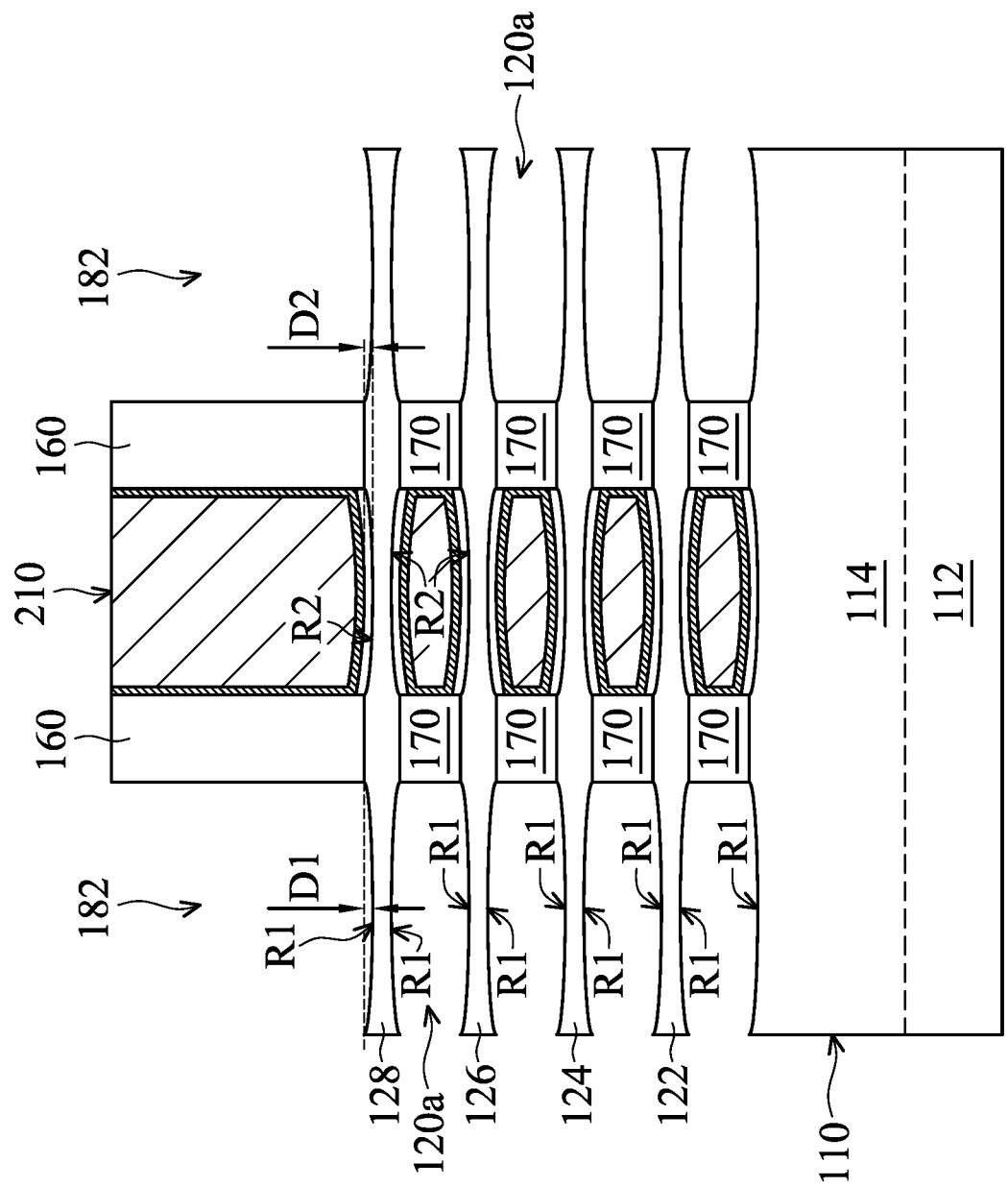

As shown in FIGS. 6B and 6C, the step of FIG. 1G is performed to remove portions of the dielectric layer 180 so as to form through holes 182 in the dielectric layer 180, in accordance with some embodiments. As shown in FIG. 6C, in some embodiments, the nanostructures 122, 124, 126 and 128 and the fin 114 exposed by the spacer structure 160 and the gate stack 210 are partially removed during removing the portions of the dielectric layer 180, in accordance with some embodiments. Therefore, the maximum depths D1 of the recesses R1 are increased, in accordance with some embodiments. As a result, the maximum depths D1 may be greater than the maximum depths D2 of the recesses R2 of the nanostructures 122, 124, 126 and 128 in the gate stack 210.

Figure 6D:
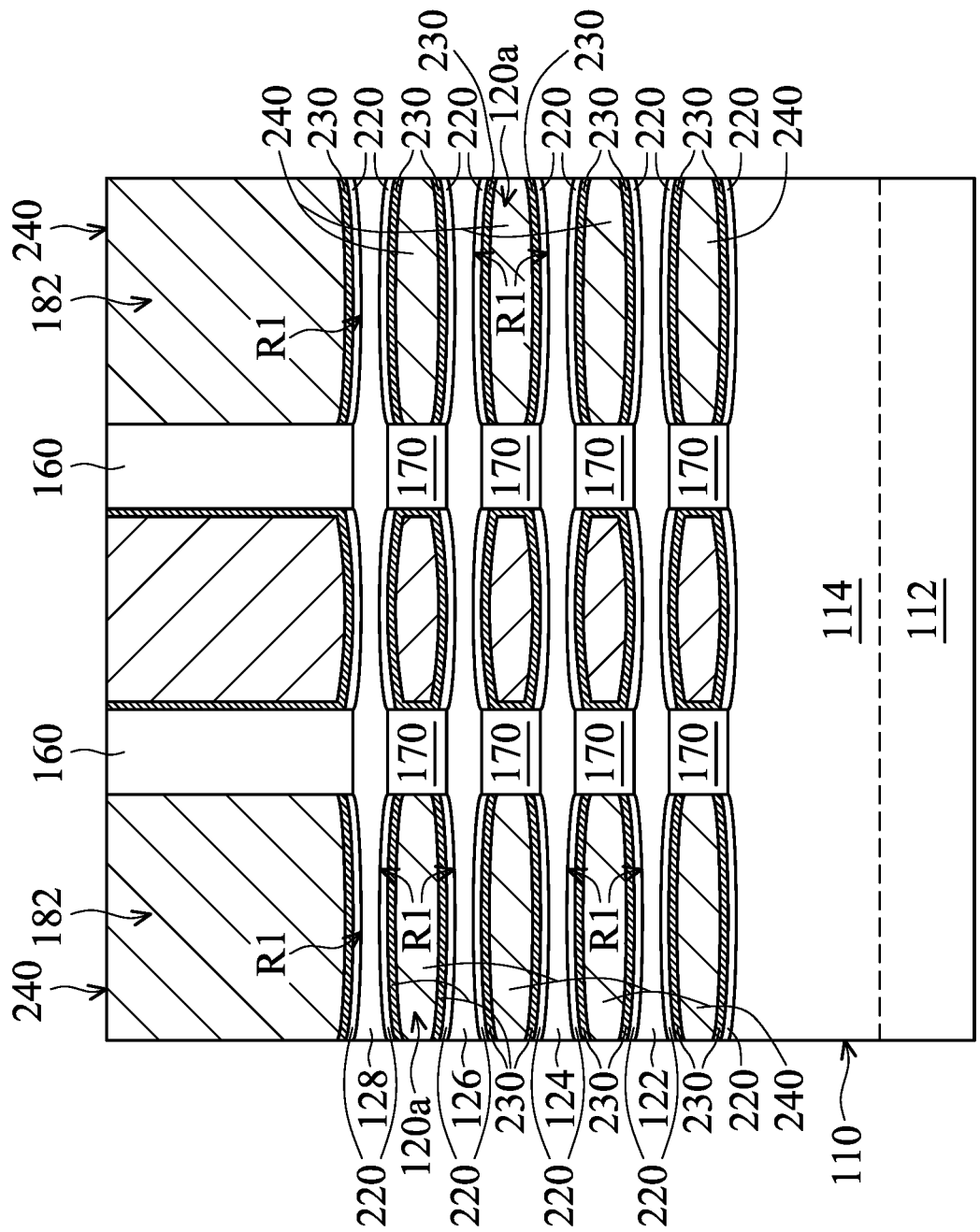

As shown in FIG. 6D, the steps of FIGS. 1H to 1J are performed to form the source/drain layers 220, the silicide layer 230, and the contact structures 240, in accordance with some embodiments. The source/drain layers 220 conformally cover the recesses R1, in accordance with some embodiments. Each source/drain layer 220 is partially embedded in the corresponding nanostructure 122, 124, 126 or 128 or the fin 114, in accordance with some embodiments. The silicide layer 230 conformally covers the source/drain layers 220, in accordance with some embodiments. The contact structures 240 are formed over the silicide layer 230, in accordance with some embodiments.

Figure 7C:
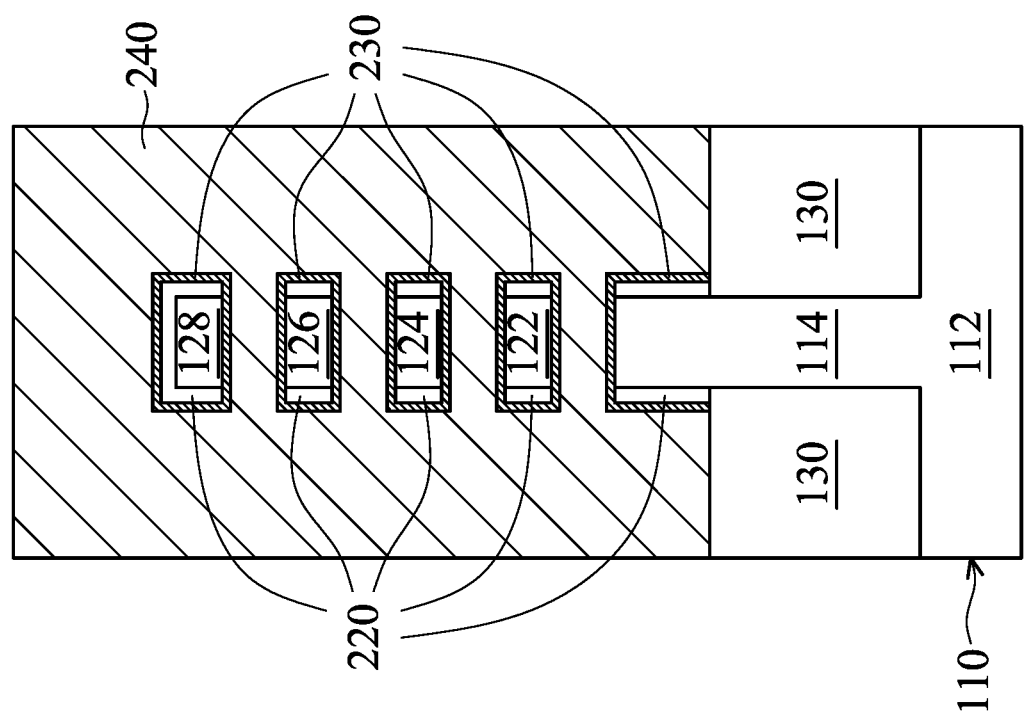

FIGS. 7A-7C are cross-sectional views of various steps of a process for forming a semiconductor device structure, in accordance with some embodiments. As shown in FIG. 7A, after the step of FIG. 1G-2, the step of FIG. 1H is performed to form the source/drain layers 220 over the nanostructures 122, 124, 126 and 128 and the fin 114, in accordance with some embodiments.

Since the gaps G2 between the nanostructures 122, 124, 126 and 128 and the fin 114 are narrow, the epitaxial gas (for forming the source/drain layers 220) is hard to diffuse into the gaps G2, which decreases the thickness of the source/drain layers 220 in the gaps G2, in accordance with some embodiments.

The source/drain layers 220 outside of the gaps G2 have a thickness T3, in accordance with some embodiments. The source/drain layers 220 in the gaps G2 have a thickness T4, in accordance with some embodiments. The thickness T3 is greater than or equal to the thickness T4, in accordance with some embodiments. In some embodiments, a ratio of the thickness T3 to the thickness T4 ranges from about 1 to about 2.

As shown in FIG. 7B, the step of FIG. 1I is performed to form the silicide layers 230, in accordance with some embodiments. Since the source/drain layers 220 in the gaps G2 is thinner, the source/drain layers 220 in the gaps G2 may be consumed up after forming the silicide layers 230. Therefore, the silicide layers 230 are in direct contact with the nanostructures 122, 124, 126 and 128 and the fin 114, in accordance with some embodiments.

As shown in FIGS. 7A and 7B, since the source/drain layers 220 in the gaps G2 may be consumed up after forming the silicide layers 230, the thickness T8 of the silicide layers 230 in the gaps G2 may be limited by the thickness T4 of the source/drain layers 220 in the gaps G2, in accordance with some embodiments.

The thickness T7 of the silicide layers 230 outside of the gaps G2 is greater than or equal to the thickness T8, in accordance with some embodiments. In some embodiments, a ratio of the thickness T7 to the thickness T8 ranges from about 1 to about 2. As shown in FIG. 7C, the step of FIG. 1J is performed to form the contact structures 240, in accordance with some embodiments. The contact structures 240 surround the silicide layers 230, in accordance with some embodiments.

Figure 8:
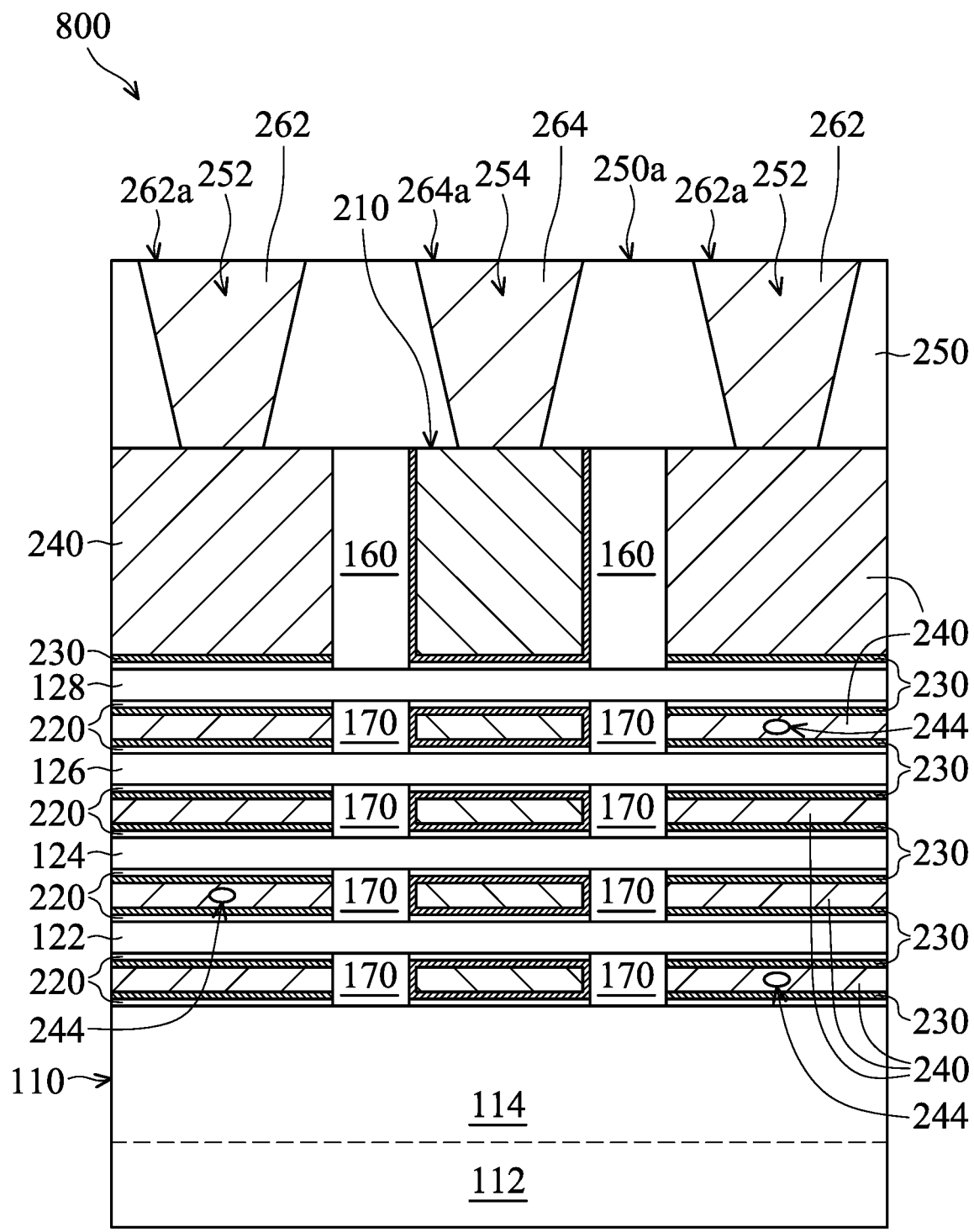
FIG. 8 is a cross-sectional view illustrating a semiconductor device structure, in accordance with some embodiments.

FIG. 8 is a cross-sectional view illustrating a semiconductor device structure 800, in accordance with some embodiments. As shown in FIG. 8, the semiconductor device structure 800 is similar to the semiconductor device structure 100 of FIG. 1K, except that the contact structures 240 of the semiconductor device structure 800 have voids 244 between the nanostructures 122, 124, 126 and 128 and the fin 114, in accordance with some embodiments.

Figure 9A:
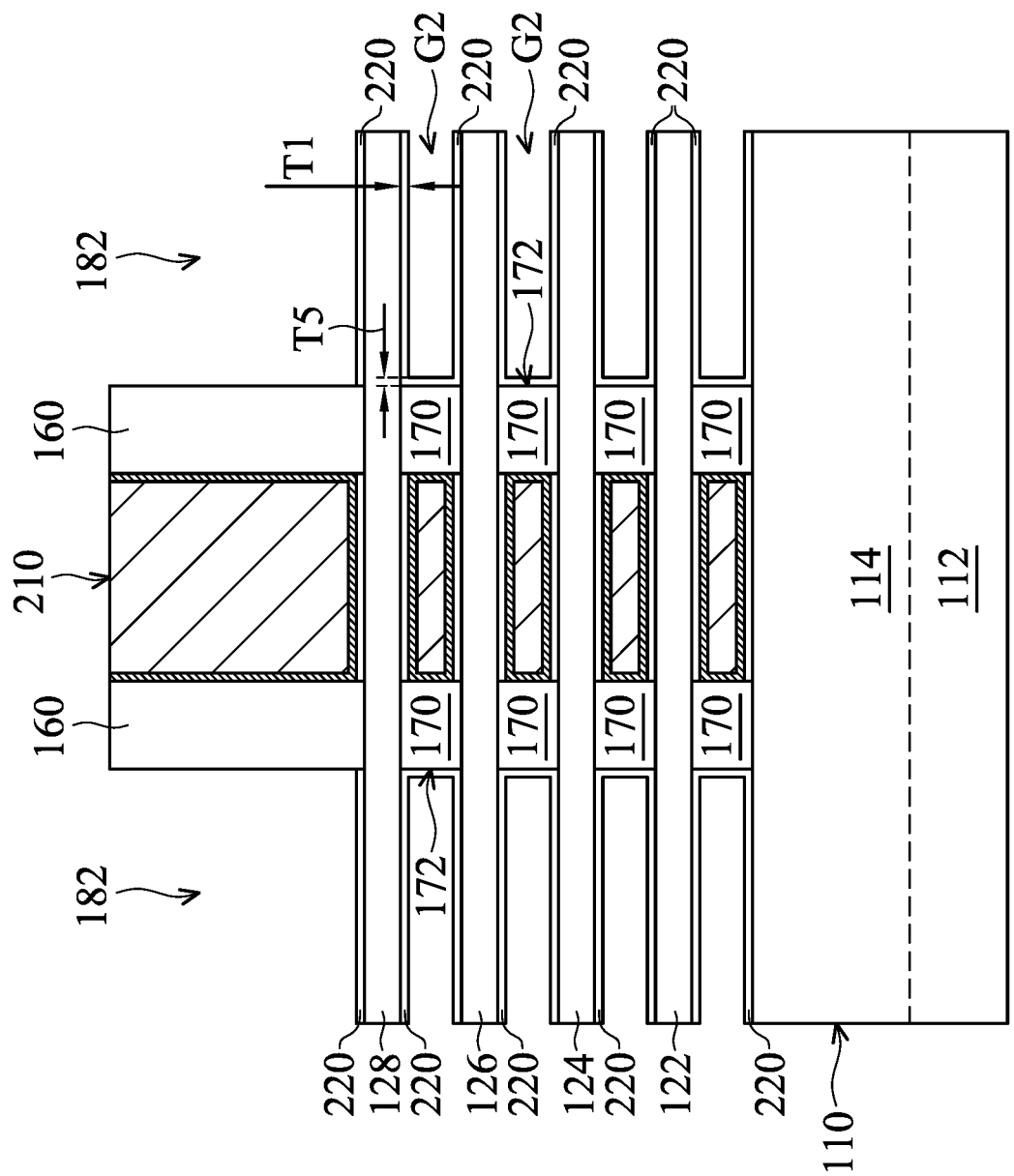
FIGS. 9A-9C are cross-sectional views of various steps of a process for forming a semiconductor device structure, in accordance with some embodiments.
Figure 9B:
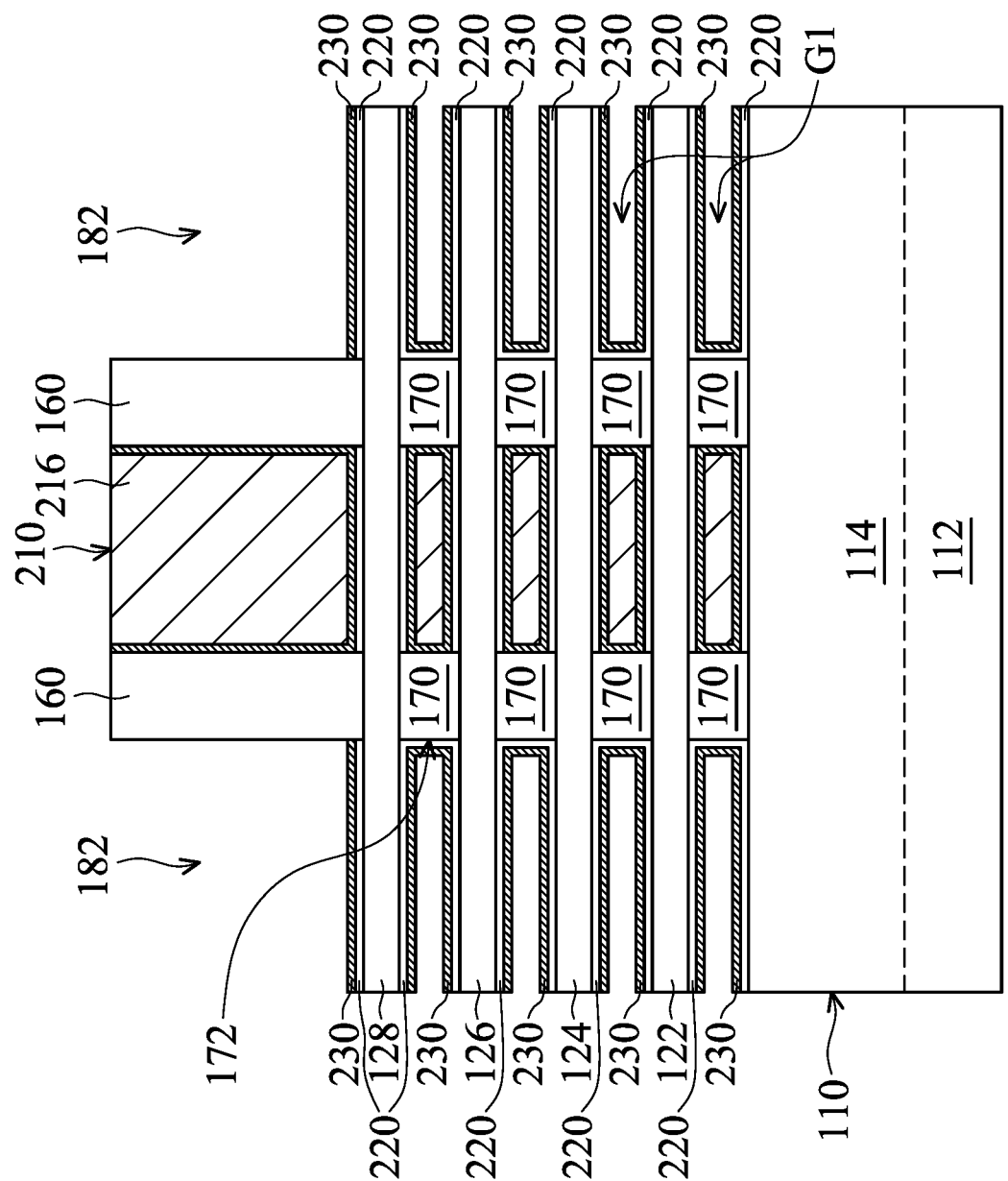
Figure 9C:
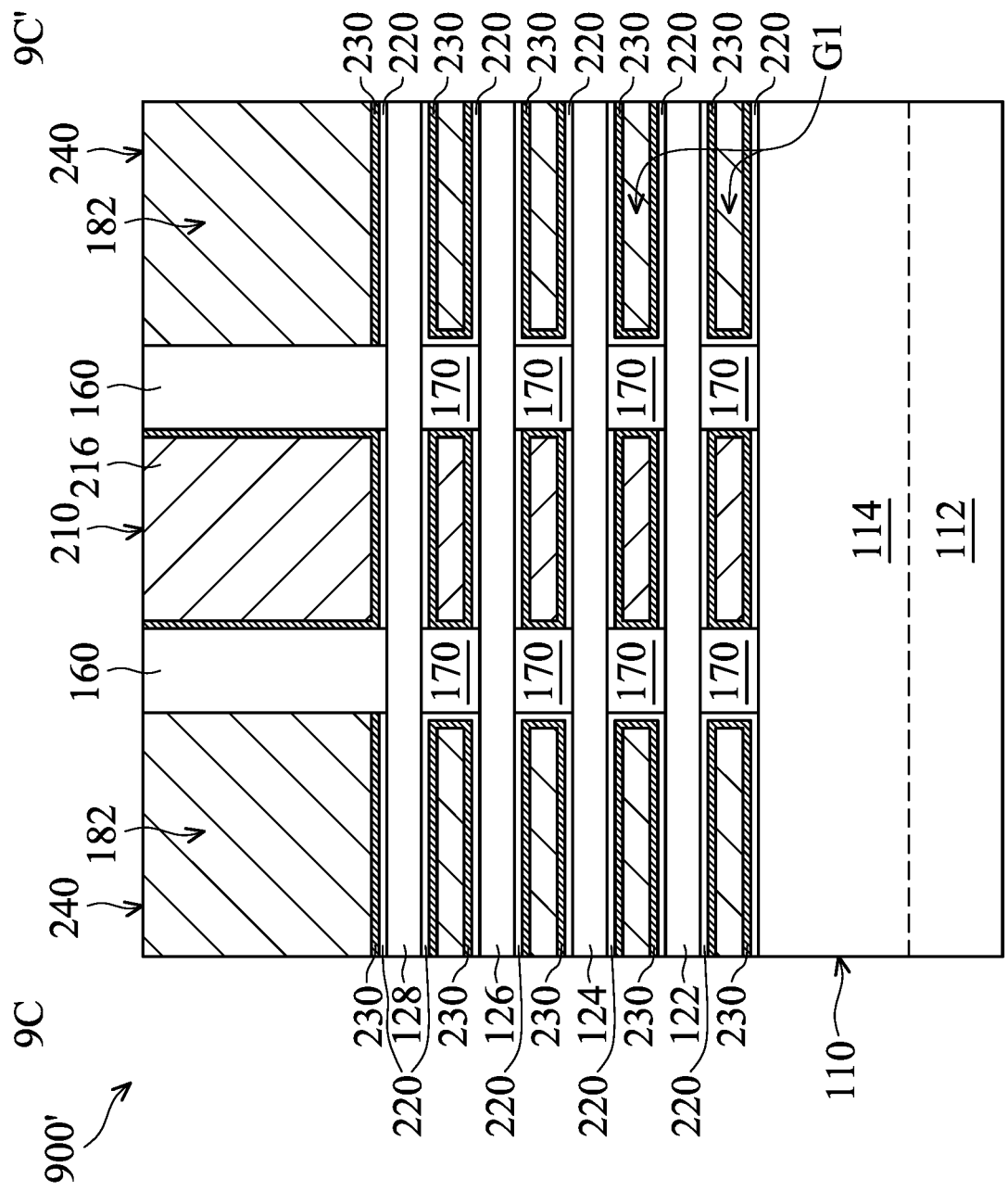
Figures 1, 9C:
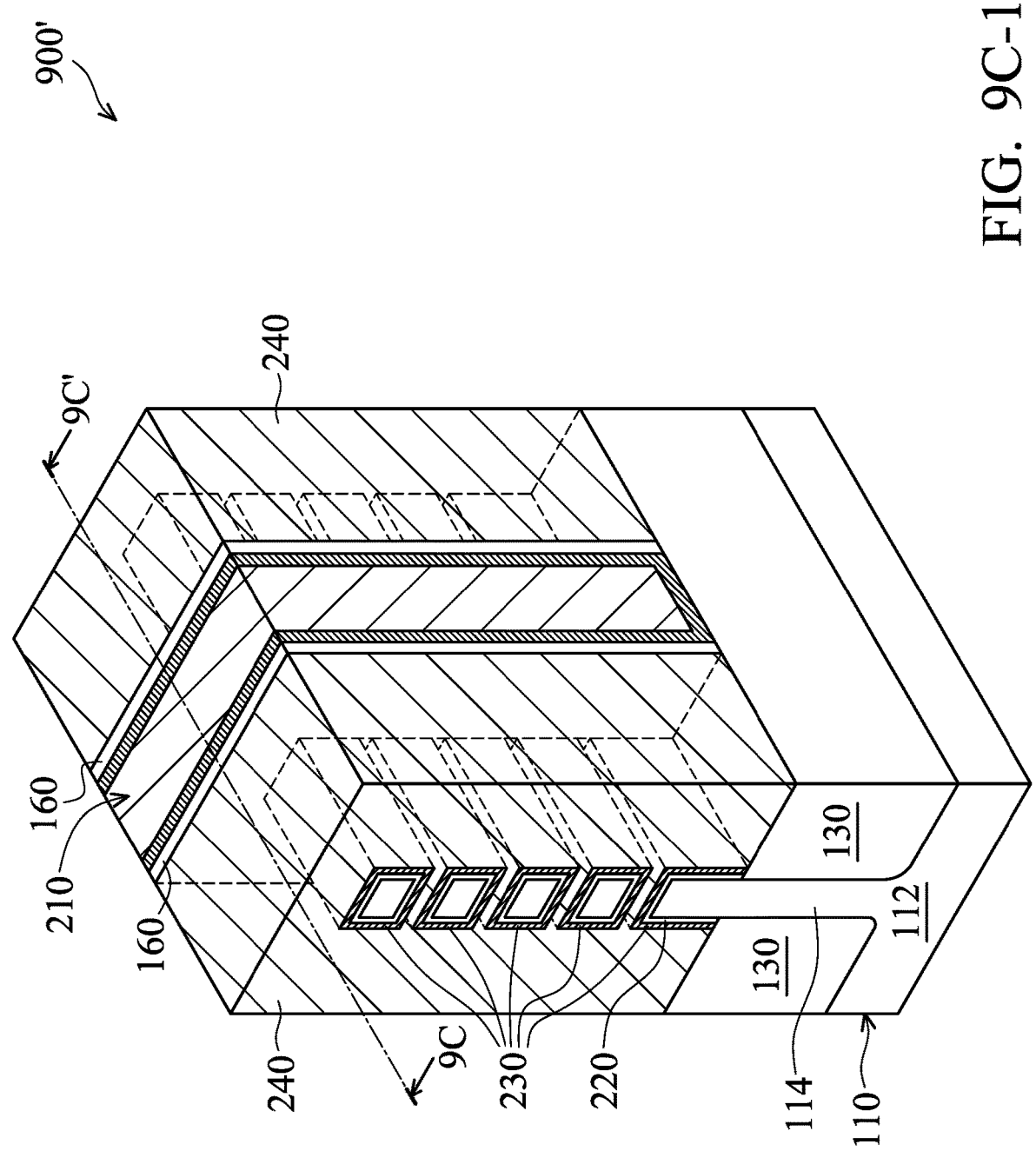

FIGS. 9A-9C are cross-sectional views of various steps of a process for forming a semiconductor device structure, in accordance with some embodiments. As shown in FIG. 9A, after the step of FIG. 1G, the step of FIG. 1H is performed to form the source/drain layers 220 over the nanostructures 122, 124, 126 and 128, the fin 114, and the inner spacer layer 170, in accordance with some embodiments.

The source/drain layers 220 conformally cover end portions of the nanostructures 122, 124, 126 and 128, an upper portion of the fin 114, and sidewalls 172 of the inner spacer layer 170, in accordance with some embodiments. The source/drain layers 220 over the nanostructures 122, 124, 126 and 128 and the fin 114 have a thickness T1, in accordance with some embodiments.

The source/drain layers 220 over the inner spacer layer 170 have a thickness T5, in accordance with some embodiments. The thickness T1 is greater than or equal to the thickness T5, in accordance with some embodiments. In some embodiments, a ratio of the thickness T1 to the thickness T5 ranges from about 1 to about 5.

In some embodiments, the source/drain layers 220 are made of a semiconductor material (e.g., silicon germanium). In some other embodiments, the source/drain layers 220 are made of a semiconductor material (e.g., silicon). When the source/drain layers 220 are made of silicon germanium, germanium of the source/drain layers 220 may diffuse into the inner spacer layer 170 from the sidewalls 172. Therefore, the germanium concentration of the inner spacer layer 170 increases toward the source/drain layers 220, in accordance with some embodiments.

As shown in FIG. 9B, the step of FIG. 1I is performed to form the silicide layer 230 over the source/drain layers 220, in accordance with some embodiments. The silicide layer 230 covers the end portions of the nanostructures 122, 124, 126 and 128, the upper portion of the fin 114, and the sidewalls 172 of the inner spacer layer 170, in accordance with some embodiments.

FIG. 9C-1 is a perspective view of the semiconductor device structure of FIG. 9C, in accordance with some embodiments. FIG. 9C is a cross-sectional view illustrating the semiconductor device structure along a sectional line 9C-9C' in FIG. 9C-1, in accordance with some embodiments.

As shown in FIGS. 9C and 9C-1, the step of FIG. 1J is performed to form the contact structures 240 over the silicide layer 230, in accordance with some embodiments. Each contact structure 240 wraps around the corresponding end portions of the nanostructures 122, 124, 126 and 128 and the upper portion of the fin 114, in accordance with some embodiments. In this step, a semiconductor device structure 900' is substantially formed, in accordance with some embodiments.

Figure 10:
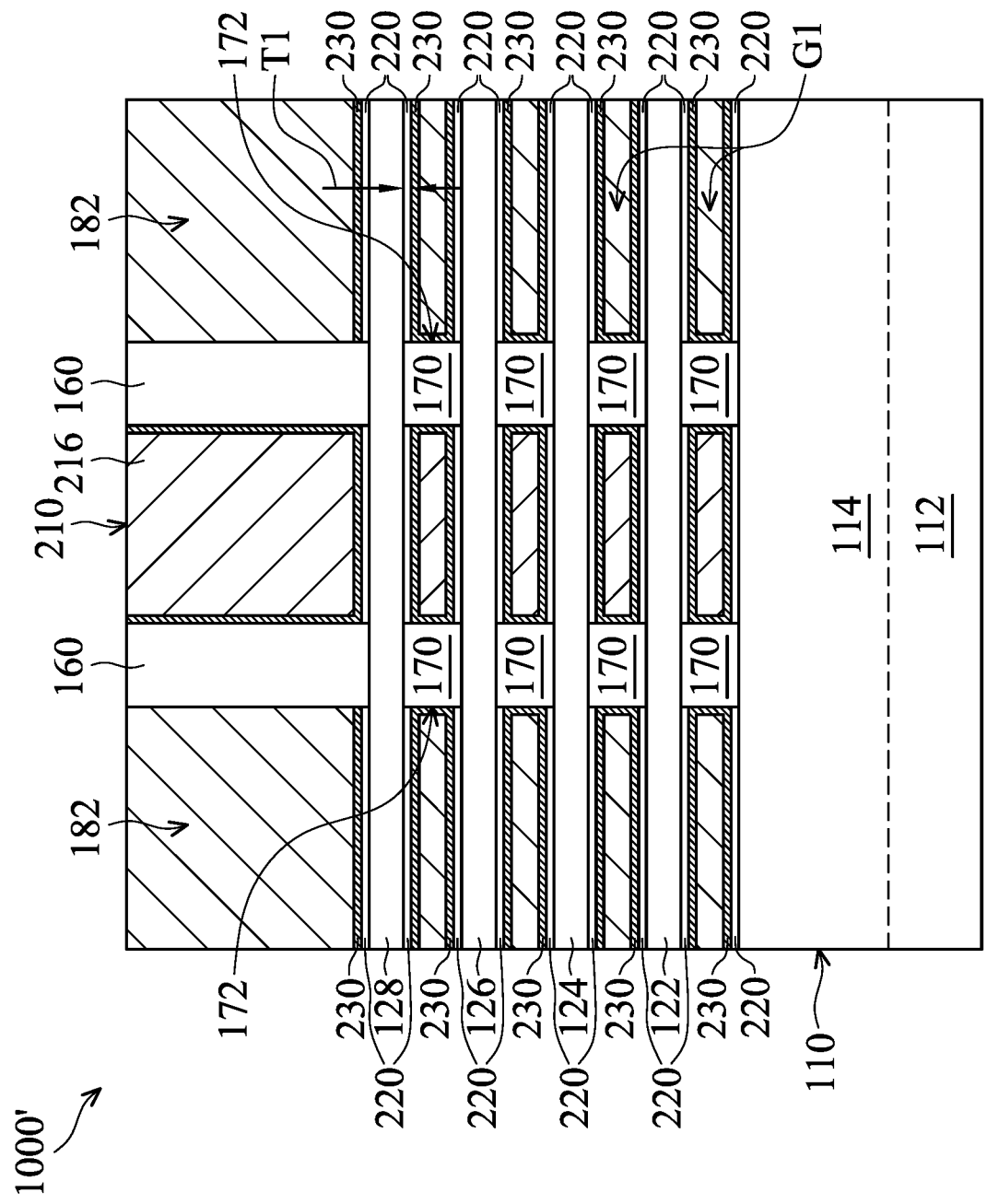
FIG. 10 is a cross-sectional view illustrating a semiconductor device structure, in accordance with some embodiments.

FIG. 10 is a cross-sectional view illustrating a semiconductor device structure 1000', in accordance with some embodiments. As shown in FIG. 10, the semiconductor device structure 1000' is similar to the semiconductor device structure 900' of FIG. 9C, except that the silicide layer 230 of the semiconductor device structure 1000' is in direct contact with the sidewalls 172 of the inner spacer layer 170, in accordance with some embodiments.

Since the source/drain layers 220 over the inner spacer layer 170 may be thinner than the source/drain layers 220 over the nanostructures 122, 124, 126 and 128 and the fin 114, the formation of the silicide layer 230 may consume up the source/drain layers 220 over the inner spacer layer 170, which results in the contact between the silicide layer 230 and the inner spacer layer 170.

Figure 11:
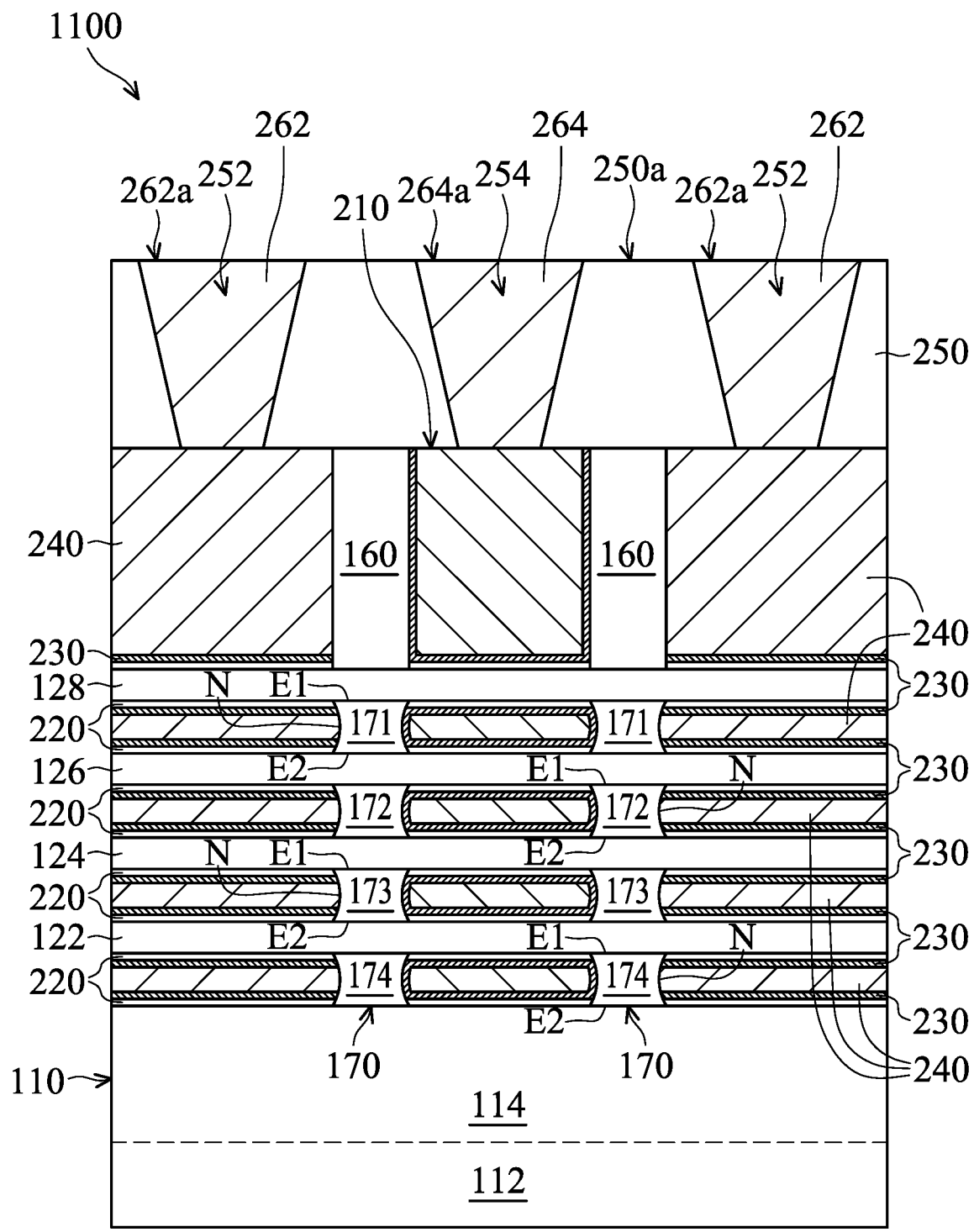
FIG. 11 is a cross-sectional view illustrating a semiconductor device structure, in accordance with some embodiments.

FIG. 11 is a cross-sectional view illustrating a semiconductor device structure 1100, in accordance with some embodiments. As shown in FIG. 11, the semiconductor device structure 1100 is similar to the semiconductor device structure 100 of FIG. 1K, except that the inner spacer layer 170 includes inner spacers 171, 172, 173, and 174, and each inner spacer 171, 172, 173, or 174 has two end portions E1 and E2 and a neck portion N between the end portions E1 and E2, in accordance with some embodiments. The neck portion N is narrower than the end portion E1, in accordance with some embodiments. The neck portion N is narrower than the end portion E2, in accordance with some embodiments.

Figure 12:
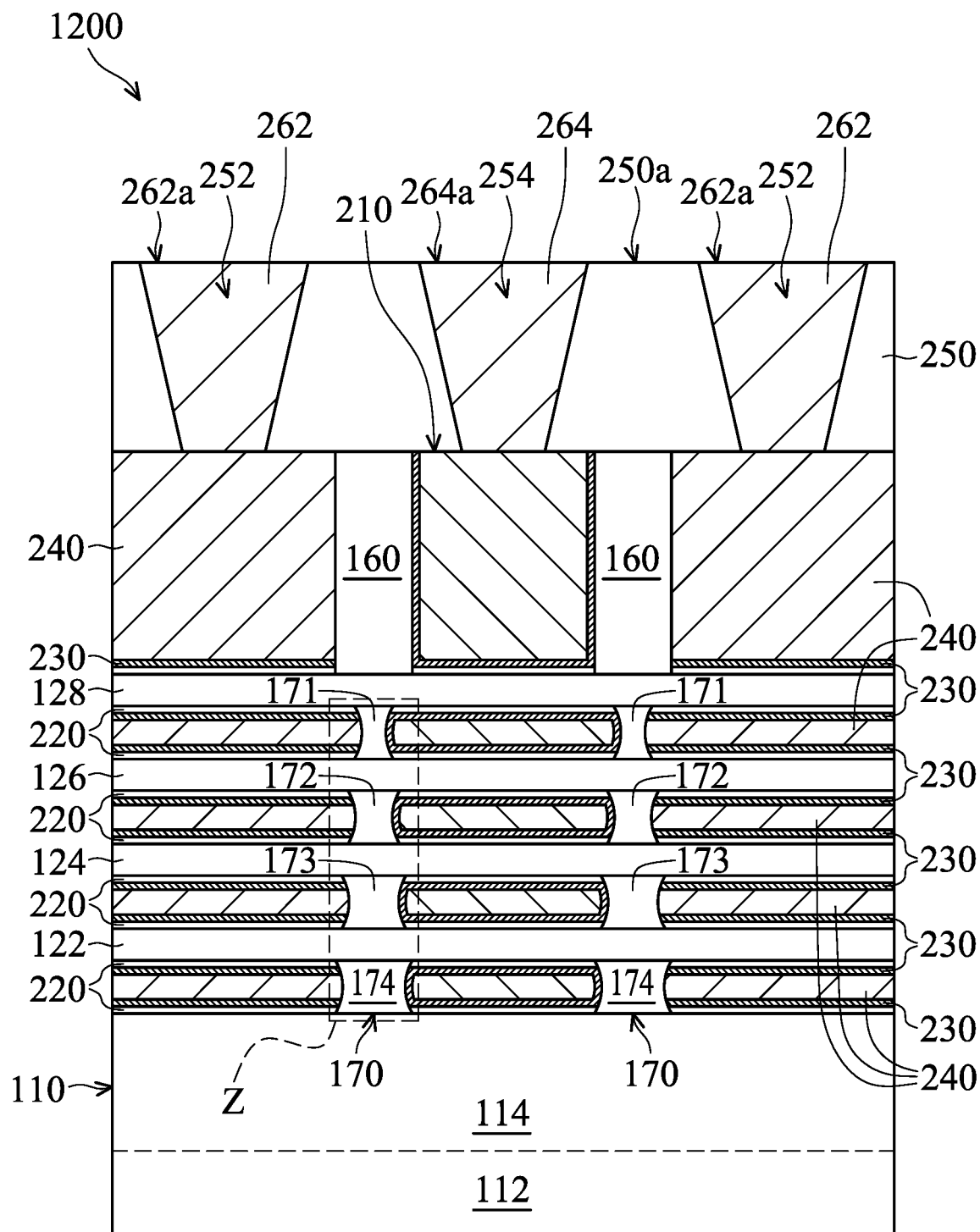
FIG. 12 is a cross-sectional view illustrating a semiconductor device structure, in accordance with some embodiments.
Figure 12A:
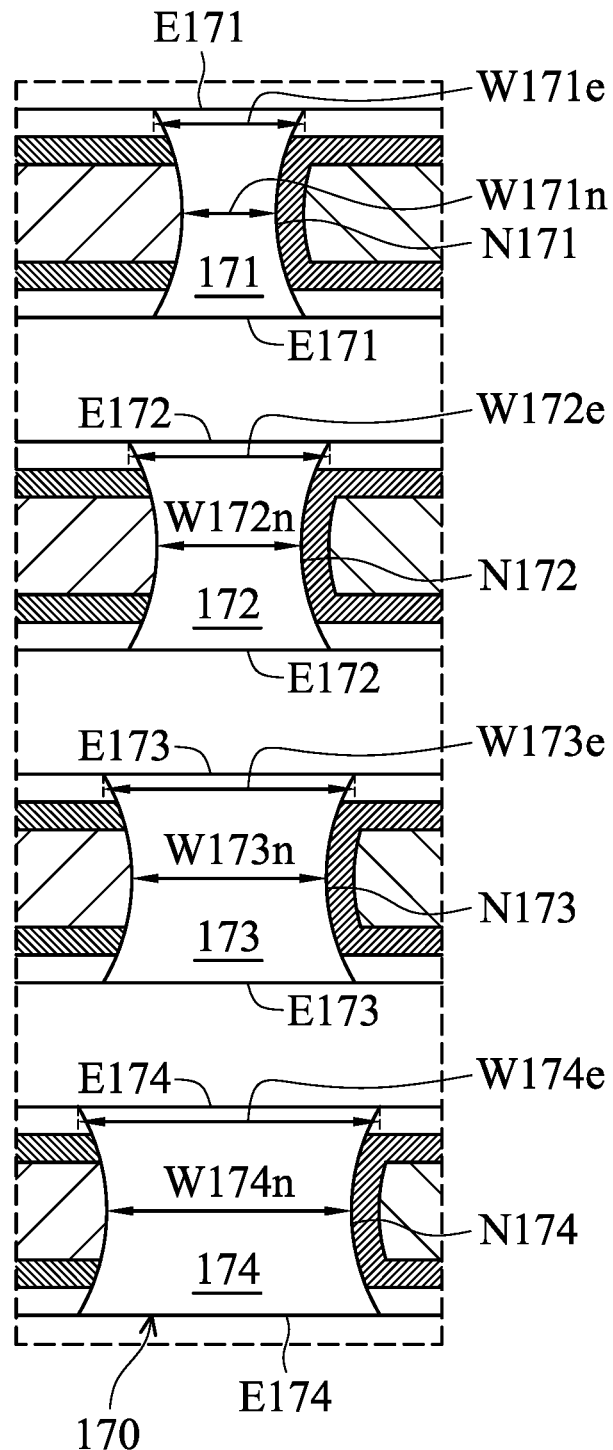
FIG. 12A is an enlarged view illustrating a portion of the semiconductor device structure of FIG. 12, in accordance with some embodiments.

FIG. 12 is a cross-sectional view illustrating a semiconductor device structure 1200, in accordance with some embodiments. FIG. 12A is an enlarged view illustrating a portion Z of the semiconductor device structure 1200 of FIG. 12, in accordance with some embodiments.

As shown in FIGS. 12 and 12A, the semiconductor device structure 1200 is similar to the semiconductor device structure 1100 of FIG. 11, except that the inner spacers 171, 172, 173, and 174 have different widths, in accordance with some embodiments.

Specifically, the inner spacer 174 is wider than the inner spacer 173, the inner spacer 173 is wider than the inner spacer 172, and the inner spacer 172 is wider than the inner spacer 171, in accordance with some embodiments. The inner spacer 171 has two end portions E171 and a neck portion N171 between the end portions E171, in accordance with some embodiments. The neck portion N171 is narrower than the end portion E171, in accordance with some embodiments. The neck portion N171 and the end portion E171 respectively have widths W171$n$ and W171$e$, in accordance with some embodiments. The width W171$n$ is less than the width W171$e$, in accordance with some embodiments.

The inner spacer 172 has two end portions E172 and a neck portion N172 between the end portions E172, in accordance with some embodiments. The neck portion N172 is narrower than the end portion E172, in accordance with some embodiments. The neck portion N172 and the end portion E172 respectively have widths W172$n$ and W172$e$, in accordance with some embodiments. The width W172$n$ is less than the width W172$e$, in accordance with some embodiments.

The inner spacer 173 has two end portions E173 and a neck portion N173 between the end portions E173, in accordance with some embodiments. The neck portion N173 is narrower than the end portion E173, in accordance with some embodiments. The neck portion N173 and the end portion E173 respectively have widths W173$n$ and W173$e$, in accordance with some embodiments. The width W173$n$ is less than the width W173$e$, in accordance with some embodiments.

The inner spacer 174 has two end portions E174 and a neck portion N174 between the end portions E174, in accordance with some embodiments. The neck portion N174 is narrower than the end portion E174, in accordance with some embodiments. The neck portion N174 and the end portion E174 respectively have widths W174$n$ and W174$e$, in accordance with some embodiments. The width W174$n$ is less than the width W174$e$, in accordance with some embodiments.

The width W174$n$ is greater than the width W173$n$, the width W173$n$ is greater than the width W172$n$, and the width W172$n$ is greater than the width W171$n$, in accordance with some embodiments. The width W174$e$ is greater than the width W173$e$, the width W173$e$ is greater than the width W172$e$, and the width W172$e$ is greater than the width W171$e$, in accordance with some embodiments.

Figure 13:
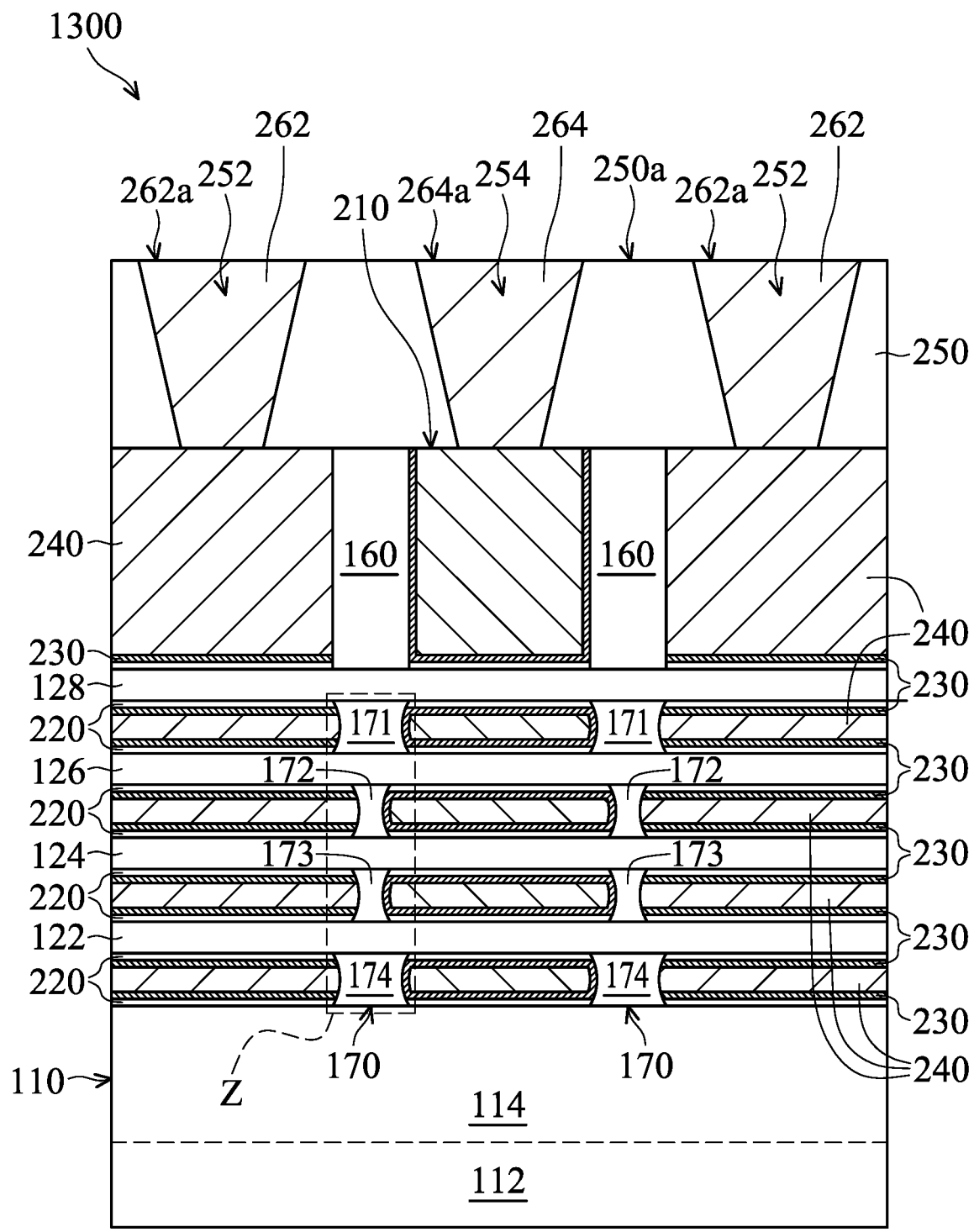
FIG. 13 is a cross-sectional view illustrating a semiconductor device structure, in accordance with some embodiments.
Figure 13A:
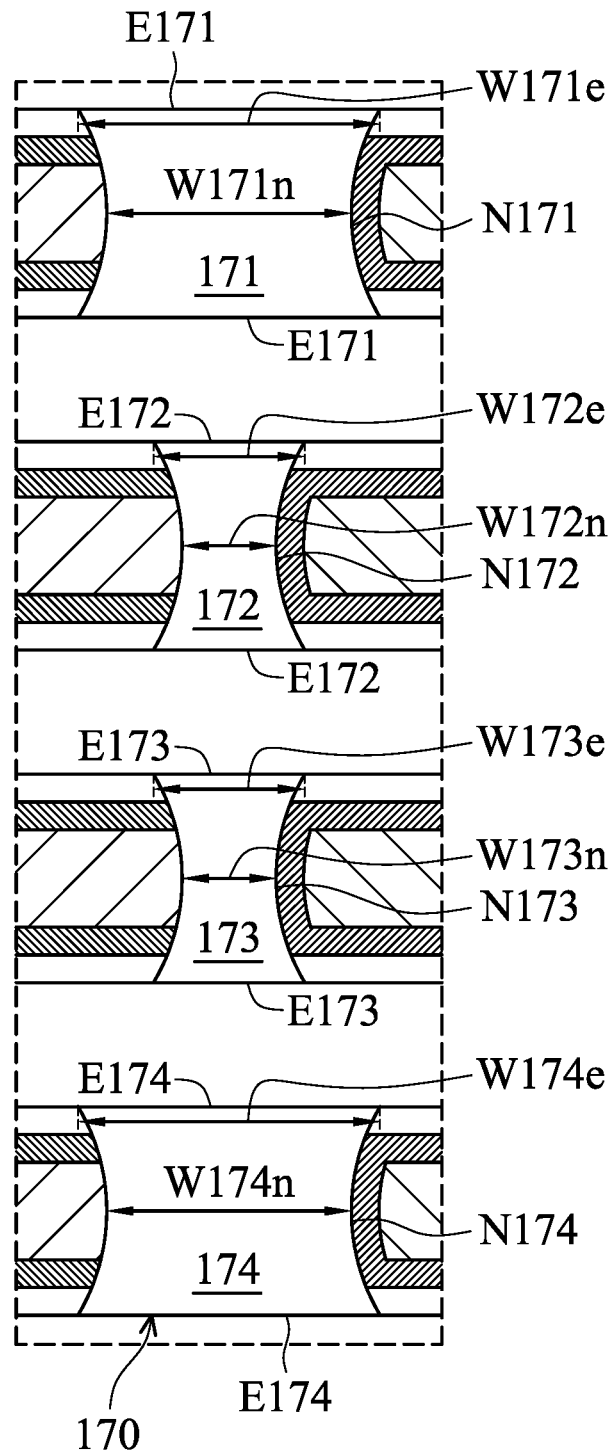
FIG. 13A is an enlarged view illustrating a portion of the semiconductor device structure of FIG. 13, in accordance with some embodiments.

FIG. 13 is a cross-sectional view illustrating a semiconductor device structure 1300, in accordance with some embodiments. FIG. 13A is an enlarged view illustrating a portion Z of the semiconductor device structure 1300 of FIG. 13, in accordance with some embodiments.

As shown in FIGS. 13 and 13A, the semiconductor device structure 1300 is similar to the semiconductor device structure 1100 of FIG. 11, except that the inner spacer 172 or 173 is narrower than the inner spacer 171 or 174, in accordance with some embodiments.

Specifically, the inner spacer 171 has two end portions E171 and a neck portion N171 between the end portions E171, in accordance with some embodiments. The neck portion N171 is narrower than the end portion E171, in accordance with some embodiments. The neck portion N171 and the end portion E171 respectively have widths W171$n$ and W171$e$, in accordance with some embodiments. The width W171$n$ is less than the width W171$e$, in accordance with some embodiments.

The inner spacer 172 has two end portions E172 and a neck portion N172 between the end portions E172, in accordance with some embodiments. The neck portion N172 is narrower than the end portion E172, in accordance with some embodiments. The neck portion N172 and the end portion E172 respectively have widths W172$n$ and W172$e$, in accordance with some embodiments. The width W172$n$ is less than the width W172$e$, in accordance with some embodiments.

The inner spacer 173 has two end portions E173 and a neck portion N173 between the end portions E173, in accordance with some embodiments. The neck portion N173 is narrower than the end portion E173, in accordance with some embodiments. The neck portion N173 and the end portion E173 respectively have widths W173$n$ and W173$e$, in accordance with some embodiments. The width W173$n$ is less than the width W173$e$, in accordance with some embodiments.

The inner spacer 174 has two end portions E174 and a neck portion N174 between the end portions E174, in accordance with some embodiments. The neck portion N174 is narrower than the end portion E174, in accordance with some embodiments. The neck portion N174 and the end portion E174 respectively have widths W174n and W174e, in accordance with some embodiments. The width W174n is less than the width W174e, in accordance with some embodiments.

The width W171n or W174n is greater than the width W172n or W173n, in accordance with some embodiments. The width W171e or W174e is greater than the width W172e or W173e, in accordance with some embodiments.

Processes and materials for forming the semiconductor device structures 500, 800, 900', 1000', 1100, 1200, and 1300 may be similar to, or the same as, those for forming the semiconductor device structures 100 and 100' described above.

In accordance with some embodiments, semiconductor device structures and methods for forming the same are provided. The methods (for forming the semiconductor device structures) form contact structures surrounding nanostructures. Therefore, the distances between the nanostructures and the contact structures are substantially the same. Therefore, the currents flowing through the nanostructures are substantially the same. As a result, the uniformity in current flowing through the nanostructures is improved. Therefore, the performance of the semiconductor device structure is improved.

In accordance with some embodiments, a semiconductor device structure is provided. The semiconductor device structure includes a substrate. The semiconductor device structure includes a first nanostructure over the substrate. The semiconductor device structure includes a gate stack over the substrate and surrounding the first nanostructure. The semiconductor device structure includes a first source/drain layer surrounding the first nanostructure and adjacent to the gate stack. The semiconductor device structure includes a contact structure surrounding the first source/drain layer, wherein a first portion of the contact structure is between the first source/drain layer and the substrate.

In accordance with some embodiments, a semiconductor device structure is provided. The semiconductor device structure includes a substrate. The semiconductor device structure includes a first nanostructure over the substrate. The semiconductor device structure includes a second nanostructure over the first nanostructure. The semiconductor device structure includes a gate stack over the substrate and surrounding the first nanostructure and the second nanostructure. The semiconductor device structure includes a contact structure surrounding the first nanostructure and the second nano structure.

In accordance with some embodiments, a method for forming a semiconductor device structure is provided. The method includes providing a substrate, a first nanostructure, a gate stack, and a dielectric layer. The first nanostructure, the gate stack, and the dielectric layer are over the substrate. The first nanostructure is over the substrate. The gate stack surrounds the first nanostructure, and the dielectric layer surrounds the first nanostructure and the gate stack. The method includes removing a first portion of the dielectric layer to form a through hole in the dielectric layer. The through hole exposes a second portion of the first nanostructure and a third portion of the substrate. The method includes forming a contact structure in the through hole, wherein a fourth portion of the contact structure is between the first nanostructure and the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a substrate;
    a first nanostructure over the substrate;
    a gate stack over the substrate and surrounding the first nanostructure;
    a first source/drain layer surrounding the first nanostructure and adjacent to the gate stack, wherein the first source/drain layer is partially embedded in the first nanostructure; and
    a contact structure surrounding the first source/drain layer, wherein a first portion of the contact structure is between the first source/drain layer and the substrate.

2. The semiconductor device structure as claimed in claim 1, further comprising:
    a silicide layer surrounding the first source/drain layer, wherein the contact structure surrounds the silicide layer, and the first portion of the contact structure is between the silicide layer and the substrate.

3. The semiconductor device structure as claimed in claim 1, further comprising:
    a second nanostructure over the first nanostructure, wherein the gate stack further surrounds the second nanostructure; and
    a second source/drain layer surrounding the second nanostructure and adjacent to the gate stack, wherein the contact structure further surrounds the second source/drain layer.

4. The semiconductor device structure as claimed in claim 3, wherein a second portion of the contact structure is between the first source/drain layer and the second source/drain layer.

5. The semiconductor device structure as claimed in claim 4, further comprising:
    a first silicide layer surrounding the first source/drain layer; and
    a second silicide layer surrounding the second source/drain layer, wherein the contact structure surrounds the first silicide layer and the second silicide layer.

6. The semiconductor device structure as claimed in claim 5, wherein the second portion of the contact structure is further between the first silicide layer and the second silicide layer.

7. The semiconductor device structure as claimed in claim 1, wherein the substrate has a base and a fin over the base, the first nanostructure is over the fin, and the semiconductor device structure further comprises:
    a second source/drain layer surrounding an upper portion of the fin, wherein the contact structure further surrounds the second source/drain layer, and the first portion of the contact structure is between the first source/drain layer and the second source/drain layer.

8. The semiconductor device structure as claimed in claim 1, wherein the gate stack is partially embedded in the first nanostructure.

9. A semiconductor device structure, comprising:
a substrate;
a first nanostructure over the substrate;
a second nanostructure over the first nanostructure;
a gate stack over the substrate and surrounding the first nanostructure and the second nanostructure;
a silicide layer surrounding the first nanostructure, wherein the silicide layer is in direct contact with a top surface of the first nanostructure;
a source/drain layer between a sidewall of the first nanostructure and the silicide layer; and
a contact structure surrounding the first nanostructure and the second nanostructure.

10. The semiconductor device structure as claimed in claim 9, wherein a first portion of the contact structure is between the first nanostructure and the second nanostructure.

11. The semiconductor device structure as claimed in claim 10, wherein a second portion of the contact structure is between the first nanostructure and the substrate.

12. The method for forming the semiconductor device structure as claimed in claim 9, wherein the silicide layer is further in direct contact with a bottom surface of the first nanostructure.

13. The method for forming the semiconductor device structure as claimed in claim 9, wherein the source/drain layer is in direct contact with the first nanostructure.

14. The method for forming the semiconductor device structure as claimed in claim 13, wherein the source/drain layer is further in direct contact with the silicide layer.

15. The method for forming the semiconductor device structure as claimed in claim 9, wherein the silicide layer is further in direct contact with the substrate.

16. The method for forming the semiconductor device structure as claimed in claim 9, wherein the contact structure surrounds the silicide layer.

17. The method for forming the semiconductor device structure as claimed in claim 16, wherein the contact structure further surrounds the source/drain layer.

18. A method for forming a semiconductor device structure, comprising:
providing a substrate, a first nanostructure, a gate stack, and a dielectric layer, wherein the first nanostructure, the gate stack, and the dielectric layer are over the substrate, the gate stack surrounds the first nanostructure, and the dielectric layer surrounds the first nanostructure and the gate stack;
removing a first portion of the dielectric layer to form a through hole in the dielectric layer, wherein the through hole exposes a second portion of the first nanostructure and a third portion of the substrate;
forming a source/drain layer over and surrounding the second portion of the first nanostructure;
forming a silicide layer over and surrounding the source/drain layer, wherein the silicide layer is thinner than the source/drain layer; and
forming a contact structure in the through hole, wherein a fourth portion of the contact structure is between the first nanostructure and the substrate, and the contact structure is in direct contact with the silicide layer.

19. The method for forming the semiconductor device structure as claimed in claim 18, wherein the substrate has a base and a fin over the base, the first nanostructure is over the fin, and the method further comprises:
providing an isolation layer over the base, wherein a lower portion of the fin is embedded in the isolation layer, the first nanostructure, the gate stack, and the dielectric layer are over the isolation layer, and the through hole exposes a fifth portion of the isolation layer.

20. The method for forming the semiconductor device structure as claimed in claim 19, wherein the contact structure is in direct contact with the isolation layer.

* * * * *